US012580571B2

(12) United States Patent
Chang et al.

(10) Patent No.: US 12,580,571 B2
(45) Date of Patent: *Mar. 17, 2026

(54) MANAGING DATA TRANSFERS IN SEMICONDUCTOR DEVICES BY SEPARATING CIRCUITS FOR LOWER-SPEED-TYPE DATA AND HIGHER-SPEED-TYPE DATA

(71) Applicant: Macronix International Co., Ltd., Hsinchu (TW)

(72) Inventors: Yi-Fan Chang, Hsinchu (TW); Su-Chueh Lo, Hsinchu (TW); Jeng-Kuan Lin, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/988,186

(22) Filed: Dec. 19, 2024

(65) Prior Publication Data

US 2025/0119142 A1 Apr. 10, 2025

Related U.S. Application Data

(63) Continuation of application No. 18/181,983, filed on Mar. 10, 2023, now Pat. No. 12,218,665.

(51) Int. Cl.
*G06F 12/00* (2006.01)
*G06F 3/06* (2006.01)
(Continued)

(52) U.S. Cl.
CPC ... *H03K 19/018521* (2013.01); *G06F 3/0604* (2013.01); *G06F 3/0656* (2013.01);
(Continued)

(58) Field of Classification Search
CPC .......... H03K 19/018521; H03K 3/037; H03K 19/0005; G06F 3/0604; G06F 3/0656; G06F 3/0679; G11C 7/10
(Continued)

(56) References Cited

U.S. PATENT DOCUMENTS 5,694,614 A 12/1997 Bennett
11,087,829 B2 8/2021 Rehmeyer et al.
(Continued)

FOREIGN PATENT DOCUMENTS

DE 20 2015 001 286 U1 9/2015
EP 1 294 099 A2 3/2003
(Continued)

*Primary Examiner* — Mardochee Chery
(74) *Attorney, Agent, or Firm* — Fish & Richardson P.C.

(57) ABSTRACT

Systems, methods, circuits, and devices for managing data transfers in semiconductor devices are provided. In one aspect, a method includes: selecting a first interface to receive higher-speed-type data at a first clock frequency; transferring the higher-speed-type data with a first speed along a first data path from the first interface through a first logic circuit to a driving circuit; outputting the higher-speed-type data by the driving circuit; selecting a second interface to receive lower-speed-type data at a second clock frequency that is same as the first clock frequency; transferring the lower-speed-type data with a second speed along a second data path from the second interface through a second logic circuit to the driving circuit, the first speed being higher than the second speed; and outputting the lower-speed-type data by the driving circuit.

20 Claims, 15 Drawing Sheets

100

(51) Int. Cl.
 *G11C 7/10*    (2006.01)
 *H03K 3/037*   (2006.01)
 *H03K 19/00*   (2006.01)
 *H03K 19/0185*  (2006.01)

(52) U.S. Cl.
 CPC .............. *G06F 3/0679* (2013.01); *G11C 7/10*
    (2013.01); *H03K 3/037* (2013.01); *H03K*
           *19/0005* (2013.01)

(58) Field of Classification Search
 USPC ........................................................ 711/154
 See application file for complete search history.

(56)        References Cited

U.S. PATENT DOCUMENTS

2010/0005214 A1  1/2010 Trombley et al.
2021/0191631 A1  6/2021 Gans
2022/0129201 A1* 4/2022 Bamdhamravuri ...... G11C 5/04
2023/0056520 A1  2/2023 Lo et al.

FOREIGN PATENT DOCUMENTS

KR  10-2006-0015985  2/2006
TW    202310256 A  3/2023
WO  WO 2022/177573 A1 8/2022

* cited by examiner

Output Disable Mode

Output Disable Mode

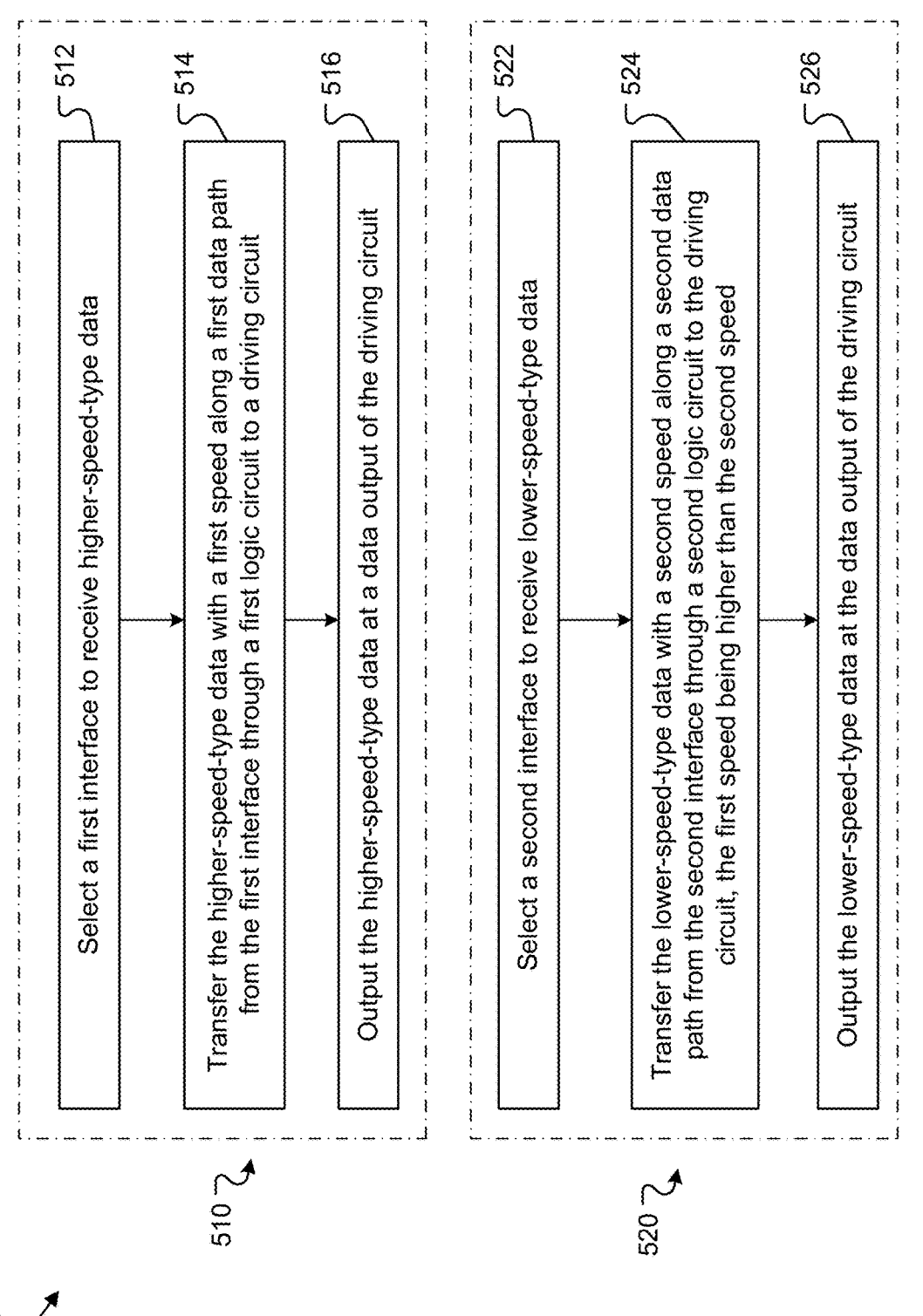

512

Select a first interface to receive higher-speed-type data

514

Transfer the higher-speed-type data with a first speed along a first data path from the first interface through a first logic circuit to a driving circuit

516

Output the higher-speed-type data at a data output of the driving circuit

510

522

Select a second interface to receive lower-speed-type data

524

Transfer the lower-speed-type data with a second speed along a second data path from the second interface through a second logic circuit to the driving circuit, the first speed being higher than the second speed

526

Output the lower-speed-type data at the data output of the driving circuit

MANAGING DATA TRANSFERS IN SEMICONDUCTOR DEVICES BY SEPARATING CIRCUITS FOR LOWER-SPEED-TYPE DATA AND HIGHER-SPEED-TYPE DATA

CROSS-REFERENCE TO RELATED APPLICATIONS

This application is a continuation application of and claims the benefit of priority under 35 U.S.C. § 120 to U.S. application Ser. No. 18/181,983, filed on Mar. 10, 2023, the entire content of which is hereby incorporated by reference.

BACKGROUND

Semiconductor devices, e.g., memory devices, are becoming smaller and faster. One limitation on data transfer speed of a semiconductor device arises from a number of complex logic circuits or components in the semiconductor device, which can dramatically decrease the data transfer speed and lengthen the transferring time.

SUMMARY

The present disclosure describes methods, devices, systems, and techniques for managing data transfers in semiconductor devices, e.g., by separating logic circuits for lower-speed-type data (e.g., SDR data) and higher-speed-type data (e.g., DDR data) to increase data transfer speed for the higher-speed-type data.

One aspect of the present disclosure features an integrated circuit, including: a first interface for receiving higher-speed-type data; a second interface for receiving lower-speed-type data; a first logic circuit coupled to the first interface; a second logic circuit coupled to the second interface; and a driving circuit separately coupled to the first logic circuit and the second logic circuit. The driving circuit is configured to output i) data corresponding to the higher-speed-type data if the first interface receives the higher-speed-type data, and ii) data corresponding to the lower-speed-type data if the second interface receives the lower-speed-type data. The first interface, the first logic circuit, and the driving circuit are arranged to form a first data path for transferring the higher-speed-type data with a first speed, and where the second interface, the second logic circuit, and the driving circuit are arranged to form a second data path for transferring the lower-speed-type data with a second speed, the first speed being higher the second speed.

In some embodiments, the first logic circuit and the second logic circuit are configured to cause data to be transferred through the first logic circuit with a higher speed than through the second logic circuit.

In some embodiments, the higher-speed-type data includes double data rate (DDR) data and the lower-speed-type data includes single data rate (SDR) data. In some embodiments, the higher-speed-type data includes quad data rate (QDR) data and the lower-speed-type data includes SDR data or DDR data.

In some embodiments, the driving circuit includes: one or more first driving subcircuits each including at least one first-type transistor, and one or more second driving subcircuits each including at least one second-type transistor. The first logic circuit includes a first logic subcircuit coupled to the one or more first driving subcircuits and a second logic subcircuit coupled to the one or more second driving subcircuits. The second logic circuit includes a third logic subcircuit coupled to the one or more first driving subcircuits and a fourth logic subcircuit coupled to the one or more second driving subcircuits. In some embodiments, the first-type transistor includes a p-type transistor, and the second-type transistor includes an n-type transistor.

In some embodiments, the driving circuit includes a data output, and the one or more first driving subcircuits are coupled between a supply voltage and the data output, and the one or more second driving subcircuits are coupled between the data output and an electrical ground.

In some embodiments, each of the one or more first driving subcircuits includes two first-type transistors coupled in series between the supply voltage and the data output, and where each of the first logic subcircuit and the third logic subcircuit is coupled to a respective first-type transistor of the two first-type transistors in each of the one or more first driving subcircuits. Each of the one or more second driving subcircuits includes two second-type transistors coupled in series between the data output and the electrical ground, and where each of the second logic subcircuit and the fourth logic subcircuit is coupled to a respective second-type transistor of the two second-type transistors in each of the one or more second driving subcircuits.

In some embodiments, the second logic circuit is configured such that, if the first interface is selected to receive the higher-speed-type data, the respective first-type transistor coupled to the third logic subcircuit and the respective second-type transistor coupled to the fourth logic subcircuit are turned on, and the driving circuit outputs the data corresponding to the higher-speed-type data at the data output. The first logic circuit is configured such that, if the second interface is selected to receive the lower-speed-type data, the respective first-type transistor coupled to the first logic subcircuit and the respective second-type transistor coupled to the second logic subcircuit are turned on, and the driving circuit outputs the data corresponding to the lower-speed-type data at the data output.

In some embodiments, the first logic subcircuit includes a first NAND gate having a first input for receiving inverted higher-speed-type data and a second input for receiving a first control signal, and the second logic subcircuit includes a first NOR gate having a first input for receiving the inverted higher-speed-type data and a second input for receiving a second control signal.

In some embodiments, the third logic subcircuit includes a second NAND gate, and the fourth logic subcircuit includes a second NOR gate, and the second NAND gate includes at least one more input than the first NAND gate, and the second NOR gate includes at least one more input than the first NOR gate.

In some embodiments, the first control signal and the second control signal are configured to perform at least one of: i) allowing to output the higher-speed-type data if the first interface is selected to receive the higher-speed-type data, ii) keeping a respective first-type transistor coupled to the first logic subcircuit on and a respective second-type transistor coupled to the second logic subcircuit on if the second interface is selected to receive the lower-speed-type data or in response to receiving an on die termination (ODT) enable signal for enabling an ODT mode, or iii) keeping the respective first-type transistor coupled to the third logic subcircuit off and the respective second-type transistor coupled to the fourth logic subcircuit off in response to receiving an output disable signal for disabling the data output of the driving circuit.

In some embodiments, the integrated circuit further includes: an additional NOR gate having a first input for receiving the ODT enable signal, a second input for receiving an inverted higher-speed-type enable signal, and an output for outputting the first control signal to the second input of the first NAND gate, and an additional inverter configured to receive the first control signal from the output of the additional NOR gate and output the second control signal to the second input of the first NOR gate, the second control signal being an inversion of the first control signal.

In some embodiments, the first logic subcircuit further includes: a first inverter configured to receive the higher-speed-type data from the first interface and output the inverted higher-speed-type data to the first input of the first NAND gate, and a second inverter including an input coupled to an output of the first NAND gate and an output coupled to the respective first-type transistor coupled to the first logic subcircuit in each of the one or more first driving subcircuits. The second logic subcircuit further includes: a third inverter configured to receive the higher-speed-type data from the first interface and output the inverted higher-speed-type data to the first input of the first NOR gate, and a fourth inverter including an input coupled to an output of the first NOR gate and an output coupled to the respective second-type transistor coupled to the second logic subcircuit in each of the one or more second driving subcircuits.

In some embodiments, the third logic subcircuit includes: an OR gate having a first input for receiving the lower-speed-type data from the second interface, a second input for receiving an ODT enable signal, a third input for receiving a higher-speed-type enable signal, and an output, and a second NAND gate having a first input coupled to the output for the OR gate, a second input for receiving an output enable signal, and an output coupled to a respective first-type transistor coupled to the third logic subcircuit in each of the one or more first driving subcircuits. The fourth logic subcircuit includes: an AND gate having a first input for receiving the lower-speed-type data from the second interface, a second input for receiving an inversion of the ODT enable signal, a third input for receiving an inversion of the higher-speed-type enable signal, and an output, and a second NOR gate having a first input coupled to the output of the AND gate, a second input for receiving an inversion of the output enable signal, and an output coupled to a respective second-type transistor coupled to the fourth logic subcircuit in each of the one or more second driving subcircuits.

In some embodiments, the integrated circuit is configured to perform at least one of: i) allowing to output the lower-speed-type data if the second interface is selected to receive the lower-speed-type data, ii) keeping a respective first-type transistor coupled to the third logic subcircuit on and a respective second-type transistor coupled to the fourth logic subcircuit on if the first interface is selected to receive the higher-speed-type data or in response to receiving the ODT enable signal for enabling the ODT mode and the output enable signal with a higher voltage level, or iii) keeping the respective first-type transistor coupled to the third logic subcircuit off and the respective second-type transistor coupled to the fourth logic subcircuit off in response to receiving the output disable signal for disabling the data output of the driving circuit.

In some embodiments, the driving circuit includes a plurality of first driving subcircuits coupled in parallel with the supply voltage and the data output and a plurality of second driving subcircuits coupled in parallel with the data output and the electrical ground. The second NAND gate includes a third input for receiving a first selection signal for selecting one or more particular first driving subcircuits for data transfer among the plurality of first driving subcircuits. The second NOR gate includes a third input for receiving a second selection signal for selecting one or more particular second driving subcircuits for the data transfer among the plurality of second driving subcircuits. Each of the first selection signal and the second selection signal is associated with a predetermined impedance for the driving circuit, and where the predetermined impedance for the driving circuit is based on a combination of the one or more particular first driving subcircuits and the one or more particular second driving subcircuits.

In some embodiments, a number of the plurality of second driving subcircuits is identical to a number of the plurality of first driving subcircuits. In some embodiments, a number of the plurality of second driving subcircuits is different from a number of the plurality of first driving subcircuits.

In some embodiments, the plurality of second driving subcircuits corresponds to the plurality of first driving subcircuits, and the one or more particular second driving subcircuits correspond to the one or more particular first driving subcircuits. In some embodiments, the second selection signal is an inversion of the first selection signal or is controlled independently from the first selection signal.

In some embodiments, each of the one or more first driving subcircuits includes: a first-type transistor coupled between the supply voltage and the data output, and a first NAND gate having a first input coupled to the first logic subcircuit, a second input coupled to the third logic subcircuit, and an output coupled to the first-type transistor. Each of the one or more second driving subcircuits includes: a second-type transistor coupled between the data output and the electrical ground, and a first NOR gate having a first input coupled to the second logic subcircuit, a second input coupled to the fourth logic subcircuit, and an output coupled to the second-type transistor.

In some embodiments, the first logic subcircuit includes: a first inverter configured to invert the higher-speed-type data from the first interface, and a second NAND gate having a first input for receiving the inverted higher-speed-type data from the first inverter, a second input for receiving a first control signal, and an output coupled to the first input of the first NAND gate in each of the one or more first driving subcircuits. The second logic subcircuit includes: a second inverter configured to invert the higher-speed-type data from the first interface, and a second NOR gate having a first input for receiving the inverted higher-speed-type data from the second inverter, a second input for receiving a second control signal, and an output coupled to the first input of the first NOR gate in each of the one or more second driving subcircuits. The first control signal and the second control signal are configured to perform at least one of: i) allowing to output the higher-speed-type data if the first interface is selected to receive the higher-speed-type data, or ii) keeping the output of the second NAND gate to be "1" and the output of the second NOR gate to be "0" if the second interface is selected to receive the lower-speed-type data or in response to receiving an on die termination (ODT) enable signal for enabling an ODT mode.

In some embodiments, the integrated circuit further includes: an additional first NOR gate having a first input for receiving the ODT enable signal, a second input for receiving an inverted higher-speed-type enable signal, and an output for outputting the first control signal to the second input of the second NAND gate, and an additional inverter configured to receive the first control signal from the output of the additional first NOR gate and output the second control signal to the second input of the second NOR gate, the second control signal being an inversion of the first control signal.

In some embodiments, the integrated circuit further includes: an additional second NOR gate having a first input for receiving the ODT enable signal, a second input for receiving a higher-speed-type enable signal, and an output for outputting a third control signal. The third logic subcircuit includes: a third inverter having an input coupled to the output of the additional second NOR gate for receiving the third control signal and an output for outputting an inverted third control signal, a first OR gate having a first input coupled to the output of the third inverter for receiving the inverted third control signal, a second input coupled to the second interface for receiving the lower-speed-type data, and an output, and a first AND gate having a first input coupled to the output of the first OR gate, a second input for receiving an output enable signal, and an output coupled to the second input of the first NAND gate in each of the one or more first driving subcircuits. The fourth logic subcircuit includes: a second AND gate having a first input coupled to the second interface for receiving the lower-speed-type data, a second input coupled to the output of the additional second NOR gate for receiving the third control signal, and an output, and a second OR gate having a first input coupled to the output of the second AND gate, a second input for receiving an inversion of the output enable signal, and an output coupled to the second input of the first NOR gate in each of the one or more second driving subcircuits.

In some embodiments, the integrated circuit is configured to perform at least one of: i) allowing to output the lower-speed-type data if the second interface is selected to receive the lower-speed-type data, ii) keeping the output of the first AND gate to be "1" and the output of the second OR gate to be "0" if the first interface is selected to receive the higher-speed-type data or in response to receiving the ODT enable signal for enabling the ODT mode and the output enable signal with a higher voltage level, or iii) keeping the output of the first AND gate to be "0" and the output of the second OR gate to be "1" in response to receiving an output disable signal for disabling the data output of the driving circuit.

In some embodiments, the driving circuit includes a plurality of first driving subcircuits coupled in parallel with the supply voltage and the data output and a plurality of second driving subcircuits coupled in parallel with the data output and the electrical ground. The first AND gate includes a third input for receiving a first selection signal for selecting one or more particular first driving subcircuits for data transfer among the plurality of first driving subcircuits. The second OR gate includes a third input for receiving a second selection signal for selecting one or more particular second driving subcircuits for the data transfer among the plurality of second driving subcircuits. Each of the first selection signal and the second selection signal is associated with a predetermined impedance for the driving circuit, and where the predetermined impedance for the driving circuit is based on a combination of the one or more particular first driving subcircuits and the one or more particular second driving subcircuits.

Another aspect of the present disclosure features a semiconductor device, including: a data storage circuit configured to store data; and a data output circuit coupled to the data storage circuit, the data output circuit including: a first interface for receiving higher-speed-type data corresponding to stored data from the data storage circuit; a second interface for receiving lower-speed-type data corresponding to the stored data from the data storage circuit; a first logic circuit coupled to the first interface; a second logic circuit coupled to the second interface; and a driving circuit separately coupled to the first logic circuit and the second logic circuit. The driving circuit is configured to output i) data corresponding to the higher-speed-type data if the first interface is selected to receive the higher-speed-type data, and ii) data corresponding to the lower-speed-type data if the second interface is selected to receive the lower-speed-type data. The first logic circuit and the second logic circuit are configured to cause data to be transferred through the first logic circuit with a higher speed than through the second logic circuit.

A further aspect of the present disclosure features a memory device, including: a memory interface; a memory cell array including memory cells for storing data; a data cache circuit coupled to the memory cell array and configured to cache data from the memory cell array; and a data output buffer coupled to the data cache circuit and configured to transfer cached data from the data cache circuit to the memory interface. The data output buffer includes: a first data interface for receiving higher-speed-type data corresponding to the cached data from the data cache circuit; a second data interface for receiving lower-speed-type data corresponding to the cached data from the data cache circuit; a first logic circuit coupled to the first data interface; a second logic circuit coupled to the second data interface; and a driving circuit separately coupled to the first logic circuit and the second logic circuit, where the driving circuit is configured to output i) data corresponding to the higher-speed-type data if the first data interface is selected to receive the higher-speed-type data, and ii) data corresponding to the lower-speed-type data if the second data interface is selected to receive the lower-speed-type data. The first data interface, the first logic circuit, and the driving circuit are arranged in series to form a first data path for transferring the higher-speed-type data with a first speed, and where the second data interface, the second logic circuit, and the driving circuit are arranged in series to form a second data path for transferring the lower-speed-type data with a second speed, the first speed being higher the second speed.

In some embodiments, the memory interface is configured to receive a command including at least one of: information for selecting one of the first data interface and the second data interface for data transfer, or information for selecting an impedance of the driving circuit.

Implementations of the above techniques include methods, systems, circuits, computer program products and computer-readable media. In one example, a method can be performed in a memory device and the method can include the above-described actions. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 5 is a flow chart of an example process of managing data transfers in a semiconductor device, according to one or more implementations of the present disclosure.

Like reference numbers and designations in the various drawings indicate like elements. It is also to be understood that the various exemplary implementations shown in the figures are merely illustrative representations and are not necessarily drawn to scale.

DETAILED DESCRIPTION

Overview

Implementations of the present disclosure provide techniques for managing data transfers in semiconductor devices, e.g., for high speed data transfers such as DDR data transfers in the semiconductor devices such as memory devices.

For example, a memory device can include a memory cell array, a data cache circuit coupled to the memory cell array and configured to cache data from the memory cell array, and a data output buffer coupled to the data cache circuit and configured to transfer cached data from the data cache circuit, e.g., to an external controller or host device through a memory interface. The cached data can be transferred from the data cache circuit in different speed types. For example, at a same clock frequency, the cached data can be transferred out from the data cache circuit with a single data rate (SDR) as SDR data, with a double data rate (DDR) as DDR data, or with a quad data rate (QDR) as QDR data. The data output buffer can be configured to transfer SDR data, DDR data, or QDR data along a data path out at a data output port to the memory interface. In some embodiments, SDR is used as a lower speed type, and DDR or QDR is used as a higher speed type. In some embodiments, DDR is used as a lower speed type, and QDR is used as a higher speed type. For illustration purposes, in the present disclosure, SDR is used as an example of a lower speed type, and DDR is used as an example of a higher speed type.

Figure 2:
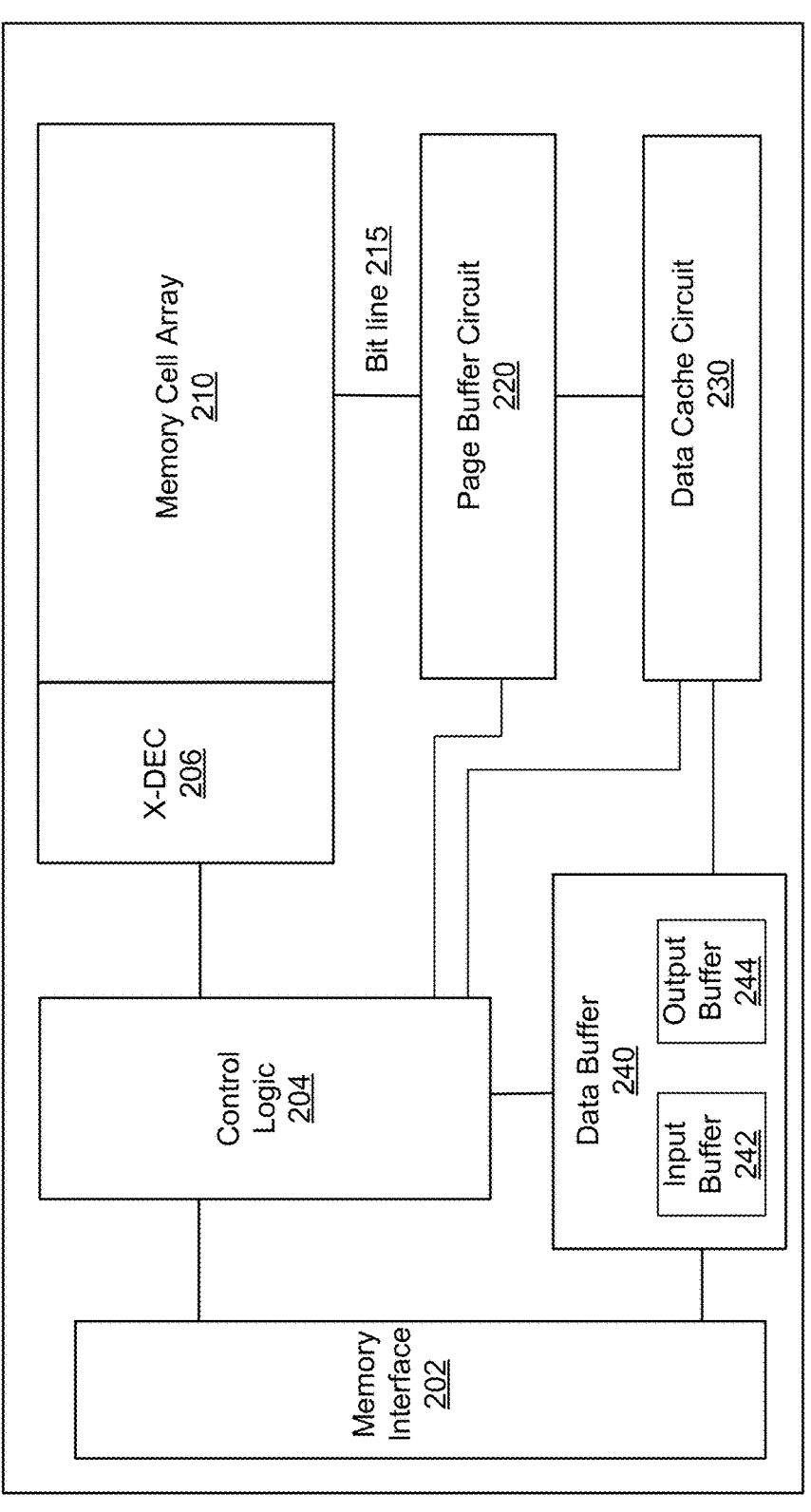
FIG. 2 illustrates an example memory device, according to one or more implementations of the present disclosure.

The data output buffer can be configured to support transferring DDR data at a higher speed (or higher frequency) and transferring SDR data at a lower speed (or lower frequency). Besides supporting the data transfer modes (e.g., SDR mode, DDR mode), the data output buffer can be also configured to implement one or more other modes (or functions), including on die termination (ODT) mode and Output Disable mode (or off chip drive (OCD) mode). For example, the ODT mode can be enabled, for example, during transferring data through a data input buffer (e.g., the data input buffer 242 as illustrated in FIG. 2) into the memory cell array, which may reduce current reflections or other noises. The Output Disable mode can be enabled, for example, during transferring data through the data input buffer into the memory cell array, which can be used to isolate the input data transfer from the data output buffer.

In some embodiments, a data path (e.g., a higher speed data path) is shared to transfer both SDR data and DDR data. A multiplexer is coupled to a DDR interface and an SDR interface and configured to select either DDR data or SDR data at a time to transfer along the shared data path through the data output buffer. Implementing all of DDR mode, SDR mode, ODT mode, and Output Disable mode on the shared data path requires a number of logic control circuits or gates (e.g., a multiplexer, NAND gates, and NOR gates), which can affect the loading of the data path and a transfer speed (or frequency) along the data path.

In some embodiments, e.g., as described with further details in FIGS. 3A-3F and FIGS. 4A-4F, in a data output buffer, the techniques can separate SDR logic and DDR logic into separate data paths for corresponding data transfers (e.g., a lower speed data path for SDR data and a higher speed data path for DDR data) and one or more operation modes (e.g., DDR mode, SDR mode, ODT mode, and/or Output Disable mode), which can reduce logic complexity on the critical path (e.g., the higher speed data path for DDR data) and reduce capacitor loading on the critical path to thereby increase the maximum speed (or frequency) of the higher speed data path.

The techniques implemented in the present disclosure can be applied to any suitable semiconductor devices, e.g., integrated circuit (IC) devices that transfer data with a high speed, or the IC devices (that output/transmit data in DDR or SDR) such as flash memories and dynamic random-access memories (DRAMs), and logic devices such as microcontrollers. For example, the techniques can be applied to various types of volatile memory or non-volatile memory, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), synchronous dynamic random-access memory (SDRAM) such as DDR SDRAM, among others. The techniques can also be applied to charge-trapping based memory, e.g., silicon-oxide-nitride-oxide-silicon (SONOS) memory, and floating-gate based memory. The techniques can be applied to two-dimensional (2D) memory or three-dimensional (3D) memory. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

Example Systems and Memory Devices

Figure 1:
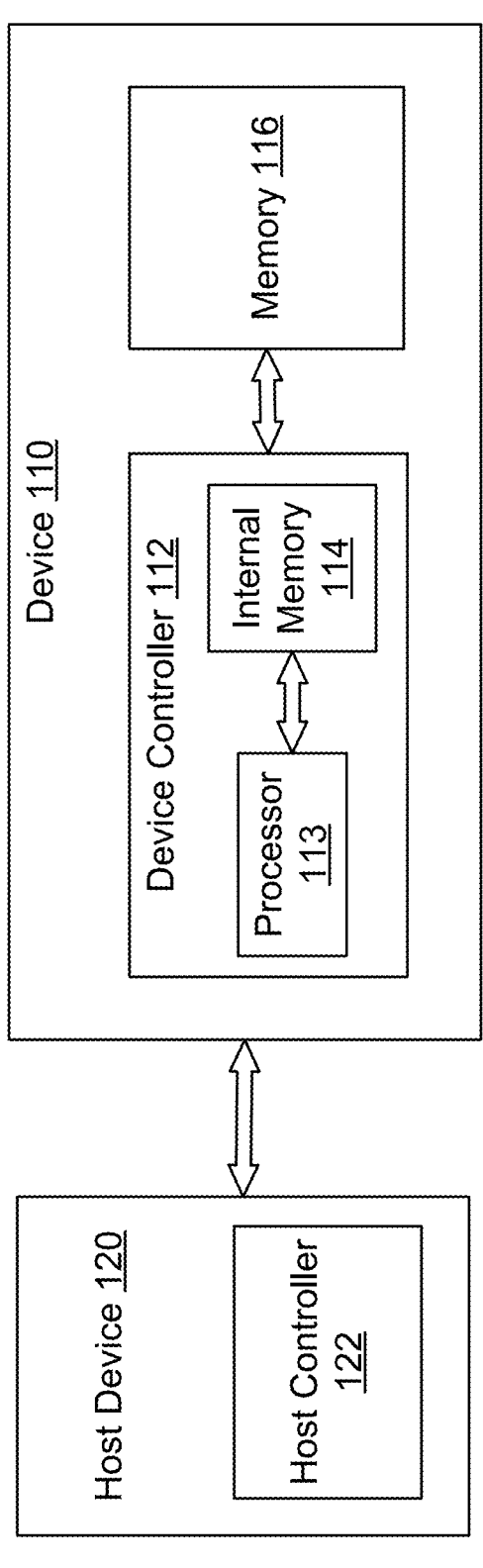
FIG. 1 illustrates an example system, according to one or more implementations of the present disclosure.

FIG. 1 illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose micropro-cessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific micro-controller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory, or some other suitable non-volatile memory. In implementations where the memory 116 is NAND flash memory, the device 110 is a flash memory, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

In some implementations, the device controller 112 is configured to receive data and instructions from and to send data to the host device 120. The device controller 112 is further configured to send data and commands to the memory 116 and to receive data from the memory 116. For example, the device controller 112 is configured to send data and a write command to instruct the memory 116 to store the data to a specified address. As another example, the device controller 112 is configured to receive a read request (or a read command) from the host device 120 and send a corresponding read command to the memory 116 to read data from a specified address in the memory 116.

The memory 116 includes a plurality of blocks. The memory 116 can be a two-dimensional (2D) memory including 2D memory blocks. The memory 116 can also be a three-dimensional (3D) memory including 3D memory blocks. Each block can include a same number of pages. Each page has a unique number in the block. Data is stored in the pages of the block according to the order of the unique numbers of the pages in the block. Each page can be read or written separately, and pages in a block can be erased together.

FIG. 2 illustrates an example configuration of a memory device 200. The memory device 200 can be implemented as the memory 116 of FIG. 1. The memory device 200 includes a memory cell array 210. The memory cell array 210 can include a number of memory cells coupled in series to a number of row word lines and a number of column bit lines.

A memory cell can include a memory transistor config-ured as a storage element. The memory transistor can include a silicon-oxide-nitride-oxide-silicon (SONOS) tran-sistor, a floating gate transistor, a nitride read only memory (NROM) transistor, or any suitable non-volatile memory metal-oxide-silicon (MOS) device that can store charges.

The memory device 200 includes a memory interface 202 having multiple input/output (I/O) ports for receiving data, e.g., from a controller such as the device controller 112 of FIG. 1 or the host controller 122 of FIG. 1, or outputting data from the memory cell array 210. The memory device 200 includes a data buffer 240 configured to buffer data through the memory interface 202. The data buffer 240 can include a data input buffer 242 configured to buffer/transmit data from a controller (e.g., the device controller 112 of FIG. 1 or the host controller 122 of FIG. 1) through the memory interface 202 to the memory cell array 210. The data buffer 240 can also include a data output buffer 244 configured to buffer/transmit out data from the memory cell array 210 through the memory interface 202, e.g., to a host device such as the host device 120 of FIG. 1.

In some embodiments, the memory device 200 further includes an X-decoder (or row decoder) 206 and an optional Y-decoder (not shown). Each memory cell is coupled to the X-decoder 206 via a respective word line and coupled to the Y-decoder via a respective bit line 215. Accordingly, each memory cell can be selected by the X-decoder 206 and the Y-decoder for read or write operations through the respective word line and the respective bit line 215.

The memory device 200 includes a page buffer circuit 220 that includes a number of page buffers. Each page buffer is connected to the memory cell array 210 through a respective bit line 215. In some embodiments, a page buffer is connected to the Y-decoder through a data line associated with a corresponding bit line 215 that connects a corresponding line of memory cells in the memory cell array 210. A page buffer is configured to control a voltage on a corresponding bit line to perform an operation, e.g., read, program, or erase, on a memory cell coupled to the corresponding bit line. A page buffer can include at least one latch circuit.

In some embodiments, the memory device 200 further includes a data cache circuit 230 coupled between the page buffer circuit 220 and the data buffer 240. During a program or erase operation, the data cache circuit 230 is configured to store data from the data buffer 240 (e.g., from the data input buffer 242) and/or output through the page buffer circuit 220 to the memory cell array 210. During a read operation, the data cache circuit 230 is configured to store data from the memory cell array through the page buffer circuit 220 and/or output data to the data buffer 240 (e.g., to the data output buffer 244).

In some embodiments, the memory device 200 further includes a control logic 204 coupled to components in the memory device 200 including the X-decoder 206 and the Y-decoder, the data buffer 240, the page buffer circuit 220, and the data cache circuit 230. The control logic 204 is configured to receive a command, address information, and/or data, e.g., from a memory controller such as the device controller 112 or the host controller 122 of FIG. 1, via the memory interface 202. The control logic 204 can also process the command, the address information, and/or the data, for example, to generate physical address information, e.g., of blocks/pages, in the memory cell array 210. The control logic 204 can include circuitry, e.g., an integrated circuit integrating multiple logics, circuits, and/or components.

In some implementations, the control logic 204 includes a data register, an SRAM buffer, an address generator, a mode logic, and a state machine. The mode logic can be configured to determine whether there is a read or write operation and provide a result of the determination to the state machine.

During a write operation, the data register in the control logic 204 can register input data from the memory interface 202, and the address generator in the control logic 204 can generate corresponding physical addresses to store the input data in specified memory cells of the memory cell array 210. The address generator can be connected the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 206 and/or the Y-decoder. The Y-decoder is configured to output the write voltage to the bit lines (BLs) for storing the input data in the specified memory cells.

During a read operation, the state machine can provide control signals to the voltage generator and the page buffer circuit 220. The voltage generator can provide a read voltage to the X-decoder 206 and the Y-decoder for selecting a memory cell. A page buffer can sense a small power signal (e.g., a current signal) that represents a data bit ("1" or "0") stored in the selected memory cell through a bit line 215 coupled to the page buffer and the selected memory cell. A sense amplifier can amplify the small power signal swing to recognizable logic levels so the data bit can be interpreted properly by logic inside or outside the memory device 200. In some implementations, the page buffer circuit 220 and/or the data cache circuit 230 are included in the sense amplifier. The data buffer 240 (e.g., the data output buffer 244) can receive the amplified voltage from the sensor amplifier and output the amplified power signal to the logic outside the memory device 200 through the memory interface 202.

Example Data Output Buffers

Figure 3A:
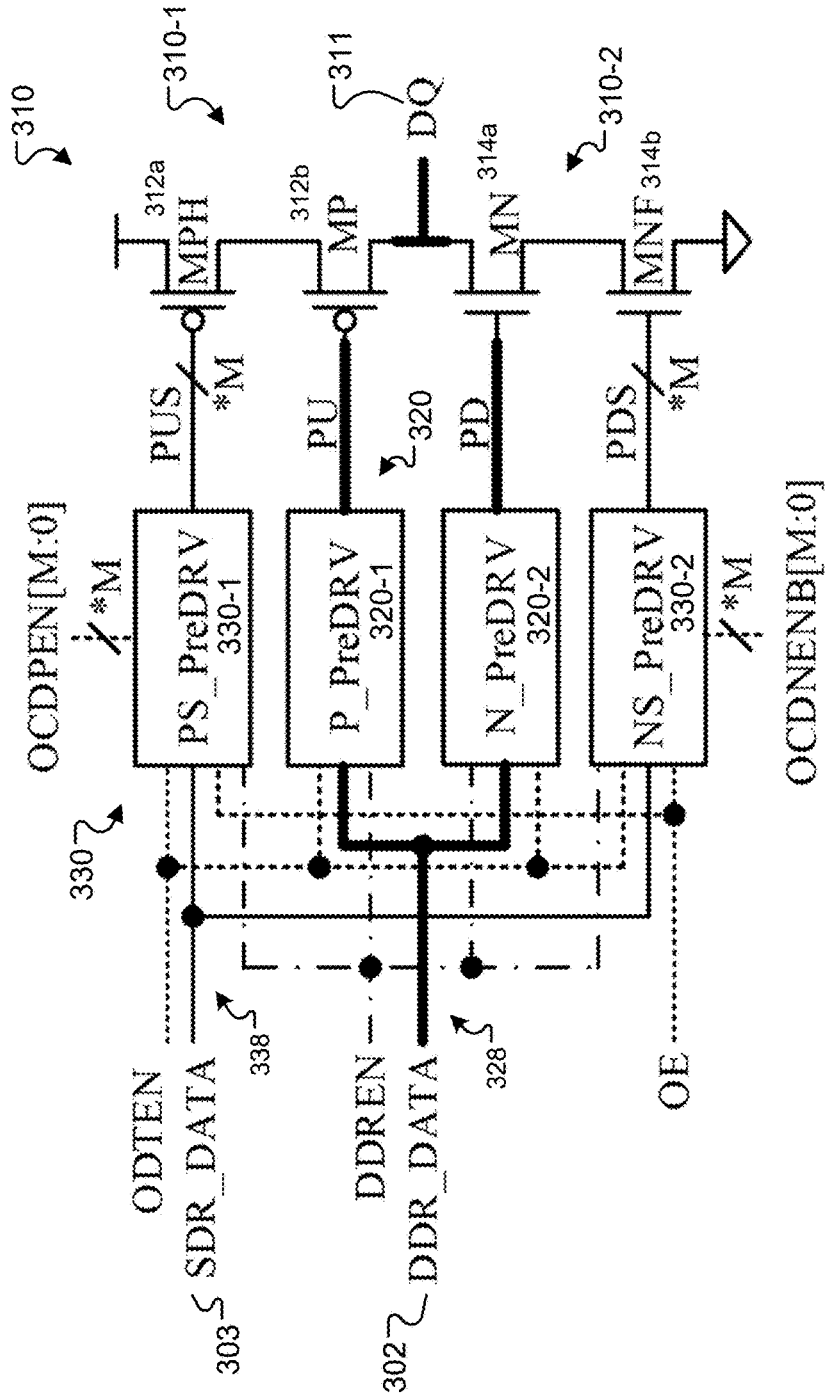
FIG. 3A is a schematic diagram of an example data output buffer for SDR and DDR data transfers, according to one or more implementations of the present disclosure.
Figure 3B:
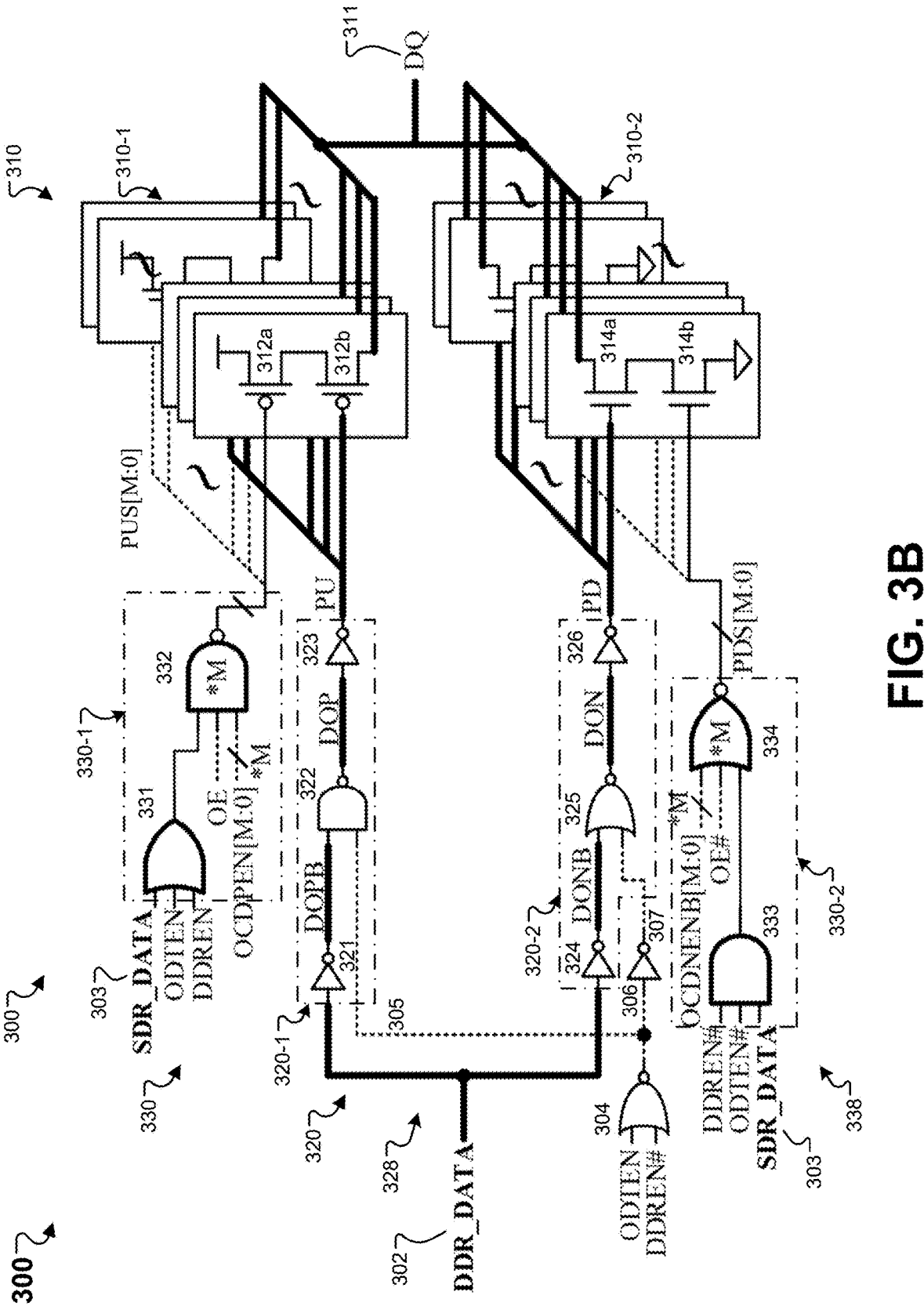
FIG. 3B is an example circuit diagram of the data output buffer of FIG. 3A, according to one or more implementations of the present disclosure.

FIGS. 3A-3B illustrate an example data output buffer 300 for SDR and DDR data transfers in a semiconductor device, according to one or more implementations of the present disclosure. The semiconductor device can be the memory 116 of FIG. 1 or the memory device 200 of FIG. 2. The data output buffer 300 can be implemented as the data output buffer 244 of FIG. 2. The data output buffer 300 can be coupled between a data storage circuit such as a data cache circuit (e.g., the data cache circuit 230 of FIG. 2) in the semiconductor device and a device interface (e.g., the memory interface 202 of FIG. 2) of the semiconductor device. The data output buffer 300 can be configured to transfer data stored or cached in the data storage circuit through the device interface to a controller (e.g., the device controller 112 or the host controller 122 of FIG. 1). FIGS. 3C to 3F illustrate the data output buffer 300 in DDR data transfer mode, SDR data transfer mode, ODT mode, and Output Disable mode, respectively.

FIG. 3A is a schematic diagram of the example data output buffer 300 for SDR and DDR data transfers, according to one or more implementations of the present disclosure. FIG. 3B is an example circuit diagram of the data output buffer 300 of FIG. 3A, according to one or more implementations of the present disclosure. The data output buffer 300 separates a higher speed data path 328 (as illustrated as thick lines in FIGS. 3A-3F) for DDR data transfer and a lower speed data path 338 for SDR data transfer, and simplifies logic circuits on the higher speed data path 328 to increase a transfer speed (or frequency) of the DDR data transfer. Also, with the separated data paths 328, 338, the data output buffer 300 does not need to include a multiplexer to separate SDR data and DDR data from input interfaces, which can further simplify the logic circuits on the higher speed data path 328 to further increase the transfer speed of the DDR data transfer.

In some embodiments, the data output buffer 300 includes a first interface (e.g., DDR interface) for receiving DDR data (or DDR_DATA) 302 and a second interface (e.g., SDR interface) for receiving SDR data (or SDR_DATA) 303. Each of the first interface and the second interface can be respectively coupled to the data storage circuit. In some embodiments, the semiconductor device is configured to receive a command from the controller. The command can include information for selecting one of DDR mode (or DDR interface) and the SDR mode (or SDR interface) for data transfer following the command. For example, each of the DDR mode and the SDR mode has a respective value, and the command can include a value set for one of the DDR mode and SDR mode. If the DDR mode or DDR interface is indicated in the command, the semiconductor device can be configured to transfer storage data (or cached data) in the data storage circuit out as DDR data to the first interface of the data output buffer 300, e.g., by transferring data at both a falling edge and a rising edge of a clock signal at a clock frequency. If the SDR mode or SDR interface is indicated in the command, the semiconductor device can be configured to transfer storage data (or cached data) in the data storage circuit out as SDR data to the second interface of the data output buffer 300, e.g., by transferring data at a falling edge or a rising edge of the clock signal at the clock frequency.

The data output buffer 300 includes a first logic circuit 320 coupled to the first interface to receive the DDR data 302 and a second logic circuit 330 coupled to the second interface to receive the SDR data 303. The data output buffer 300 also includes a driving circuit 310 separately coupled to the first logic circuit 320 and the second logic circuit 330. The driving circuit 310 includes a data output (data output node or data queue—DQ) 311 for outputting data corresponding to the DDR data 302 or data corresponding to the SDR data 303, e.g., to the device interface. The first interface, the first logic circuit 320, and the driving circuit 310 can be arranged in series to form the higher speed data path 328 to transfer the DDR data 302 with a first speed. The second interface, the second logic circuit 330, and the driving circuit 310 can be arranged in series to form the lower speed data path 338 to transfer the SDR data 303 with a second speed. The first speed can be higher than the second speed, e.g., more than 100%, twice, 5 times, 10 times, or more. In a particular example, the second speed is about 200 MHz, while the first speed is about 2,000 MHz. As discussed with further details below, the first logic circuit 320 and the second logic circuit 330 can be configured to cause data to be transferred through the first logic circuit 320 with a higher speed than through the second logic circuit 330, e.g., by including a smaller number of logic gates or transistors in the first logic circuit 320 than in the second logic circuit 330.

In some embodiments, e.g., as illustrated in FIGS. 3A-3B, the driving circuit 310 includes one or more first driving subcircuits 310-1 each having at least one first-type transistor and one or more second driving subcircuits 310-2 each having at least one second-type transistor. The first-type transistor can be a p-type transistor such as p-channel metal-oxide-semiconductor (PMOS) transistor, and the second-type transistor can be an n-type transistor such as n-channel metal-oxide-semiconductor (NMOS) transistor. The one or more first driving subcircuits 310-1 can be coupled between a supply voltage (e.g., VDD) and the data output 311, and the one or more second driving subcircuits 310-2 are coupled between the data output 311 and an electrical ground (e.g., VSS or 0 V).

The first logic circuit 320 for the DDR data 302 can include a first logic subcircuit 320-1 (e.g., P_PreDRV shown in FIG. 3A) coupled to the one or more first driving subcircuits 310-1 and a second logic subcircuit 320-2 (e.g., N_PreDRV shown in FIG. 3A) coupled to the one or more second driving subcircuits 310-2. The second logic circuit 330 for the SDR data 303 can include a third logic subcircuit 330-1 (e.g., PS_PreDRV shown in FIG. 3A) coupled to the one or more first driving subcircuits 310-1 and a fourth logic subcircuit 330-2 (e.g., NS_PreDRV shown in FIG. 3A) coupled to the one or more second driving subcircuits 310-2.

In some embodiments, each first driving subcircuit 310-1 includes two p-type transistors 312a, 312b coupled in series between the supply voltage and the data output 311, and each second driving subcircuit 310-2 includes two n-type transistors 314a, 314b coupled in series between the data output 311 and the electrical ground. As shown in FIG. 3B, each of the first logic subcircuit 320-1 and the third logic subcircuit 330-1 is coupled to a respective p-type transistor 312b, 312a in each of the one or more first driving subcircuit 310-1; each of the second logic subcircuit 320-2 and the fourth logic subcircuit 330-2 is coupled to a respective n-type transistor 314a, 314b in each of the one or more second driving subcircuit 310-2.

In some embodiments, the second logic circuit 330 is configured such that, if the first interface (e.g., DDR interface) is selected to receive the DDR data 302, the respective p-type transistor 312a coupled to the third logic subcircuit 330-1 and the respective n-type transistor 314b coupled to the fourth logic subcircuit 330-2 are turned on, and the driving circuit 310 outputs the data corresponding to the DDR data at the data output 311. In some embodiments, the first logic circuit 320 is configured such that, if the second interface (e.g., SDR interface) is selected to receive the SDR data 303, the respective p-type transistor 312b coupled to the first logic subcircuit 320-1 and the respective n-type transistor 314a coupled to the second logic subcircuit 320-2 are turned on, and the driving circuit 310 outputs the data corresponding to the SDR data at the data output 311.

In some embodiments, the first logic subcircuit 320-1 includes a first inverter 321, a first NAND gate 322, and a second inverter 323 that are coupled in series between the first interface and the one or more first driving subcircuits 310-1. The first inverter 321 is configured to receive the DDR data 302 from the first interface and output inverted DDR data (e.g., DOPB shown in FIG. 3B) to a first input of the first NAND gate 322. The first NAND gate 322 includes the first input for receiving the inverted DDR data DOPB, a second input for receiving a first control signal 305, and an output for outputting data DOP. The second inverter 323 includes an input coupled to the output of the first NAND gate 322 and an output for outputting data PU to the respective p-type transistor 312b in each of the one or more first driving subcircuits 310-1.

In some embodiments, the second logic subcircuit 320-2 includes a third inverter 324, a first NOR gate 325, and a fourth inverter 326 that are coupled in series between the first interface and the one or more second driving subcircuits 310-2. The third inverter 324 is configured to receive the DDR data 302 from the first interface and output the inverted higher-speed-type data (e.g., DONB shown in FIG. 3B) to a first input of the first NOR gate 325. The first NOR gate 325 includes the first input for receiving the inverted higher-speed-type data DONB, a second input for receiving a second control signal 307, and an output for outputting data DON. The fourth inverter 326 includes an input coupled to the output of the first NOR gate 325 for receiving data DON and an output for outputting data PD to the respective n-type transistor 314a in each of the one or more second driving subcircuits 310-2.

In some embodiments, the first logic circuit 320 includes an additional NOR gate 304 having a first input for receiving an ODT enable (ODTEN) signal, a second input for receiving an inverted DDR enable (DDREN#) signal, and an output for outputting the first control signal 305 to the second input of the first NAND gate 322. The inverted DDR enable signal (DDREN#) can be obtained by using an inverter to invert a DDR enable (DDREN) signal. The first logic circuit 320 can further include an additional inverter 306 coupled to the output of the additional NOR gate 304 and configured to receive the first control signal 305 and output the second control signal 307 to the second input of the first NOR gate 325. Thus, the second control signal 307 can be an inversion of the first control signal 305. In some embodiments, at least one of the additional NOR gate 304 or the additional inverter 306 can be arranged in the data output buffer 300 and out of the first logic circuit 320.

Figure 3C:
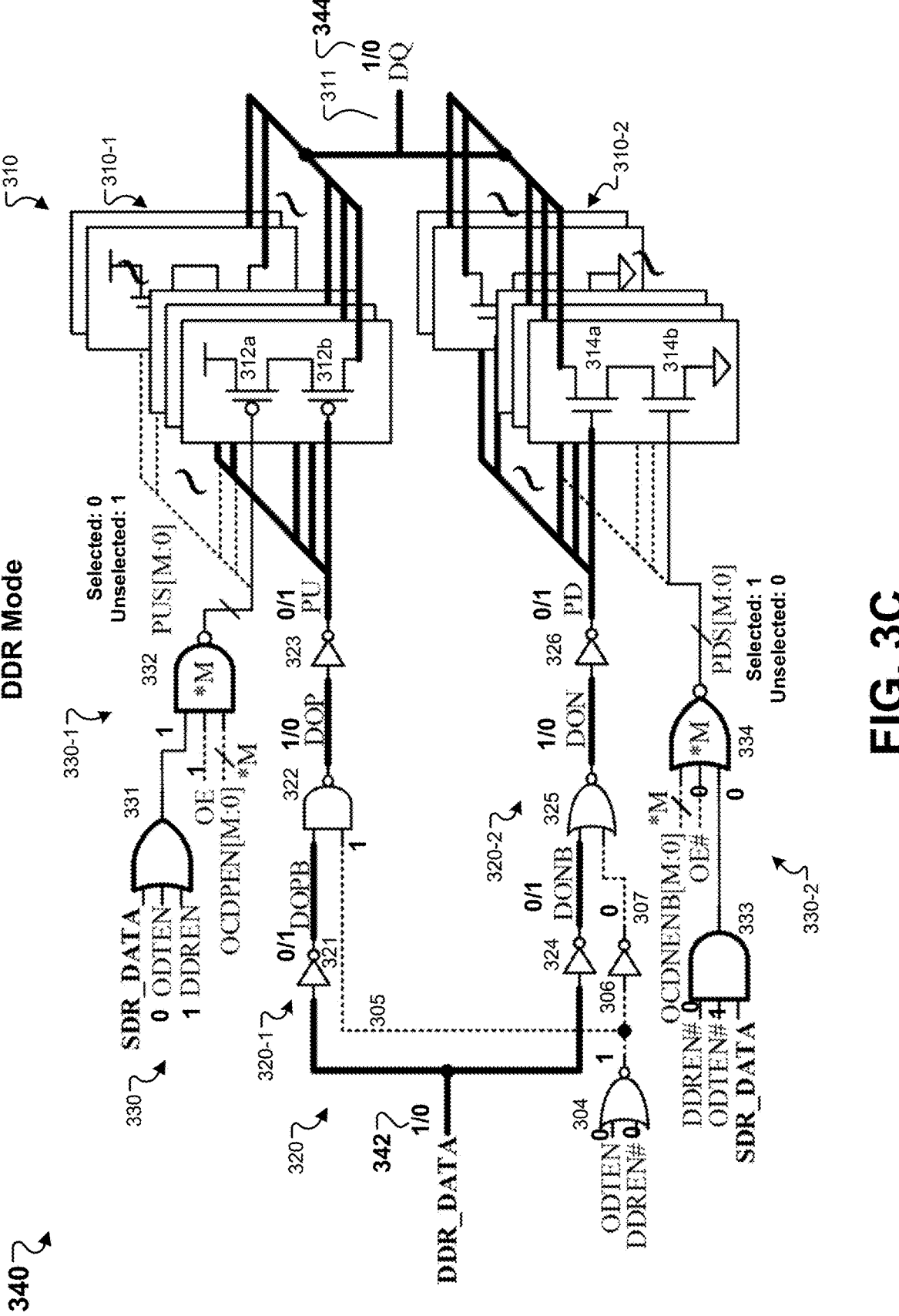
FIG. 3C illustrates DDR data transfer in the data output buffer of FIGS. 3A-3B, according to one or more implementations of the present disclosure.
Figure 3D:
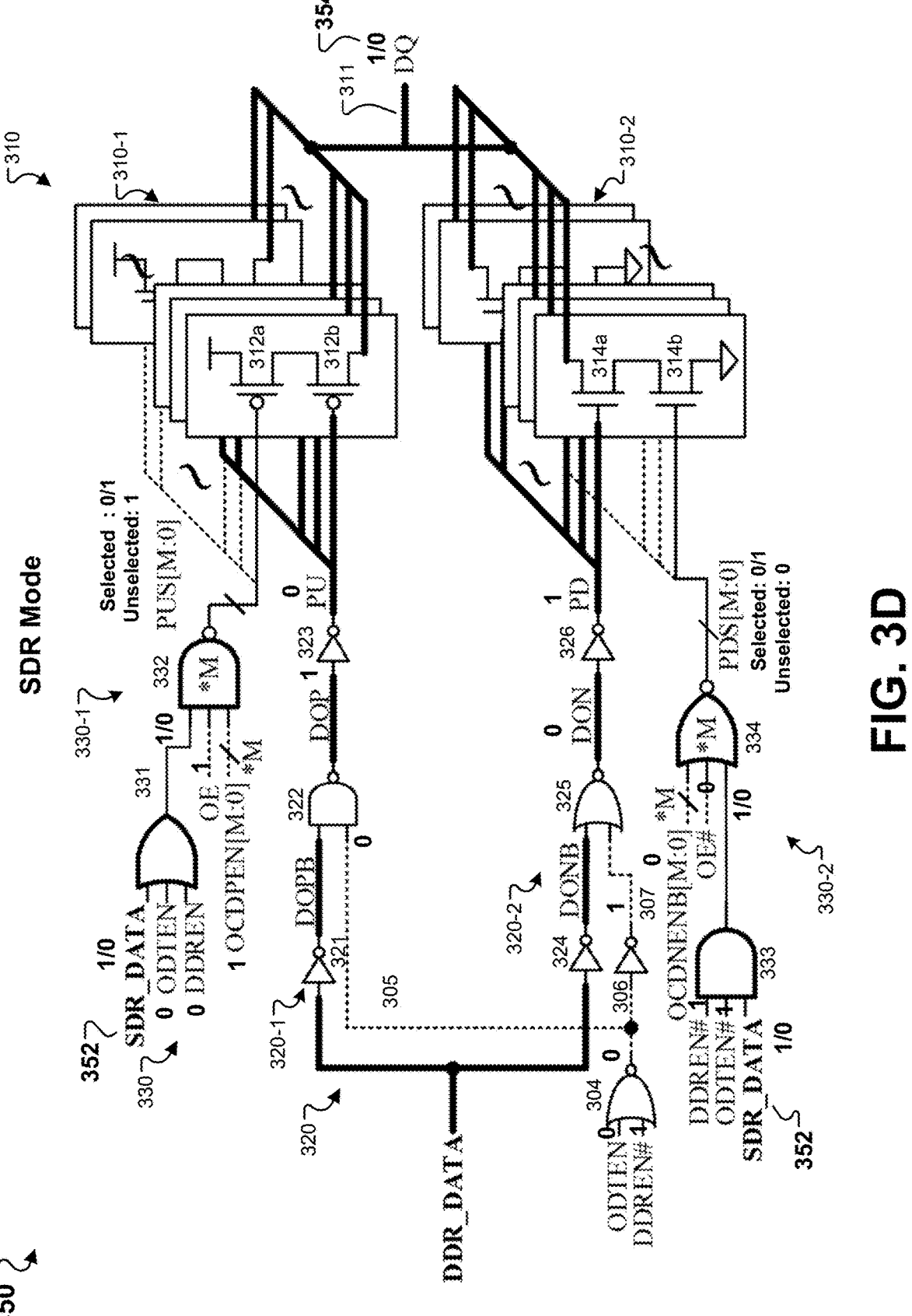
FIG. 3D illustrates SDR data transfer in the data output buffer of FIGS. 3A-3B, according to one or more implementations of the present disclosure.
Figure 3E:
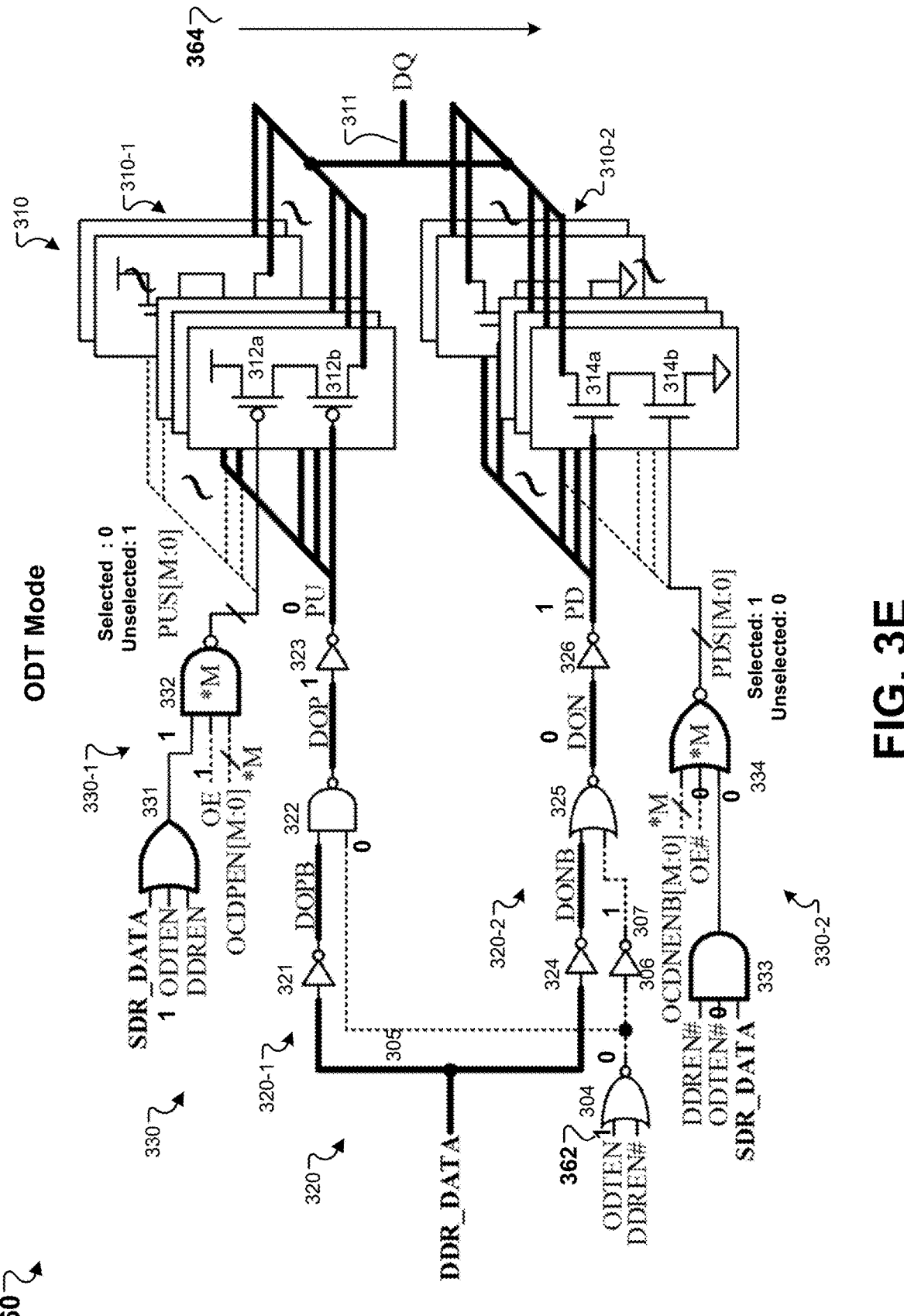
FIG. 3E illustrates ODT mode of the data output buffer of FIGS. 3A-3B, according to one or more implementations of the present disclosure.
Figure 3F:
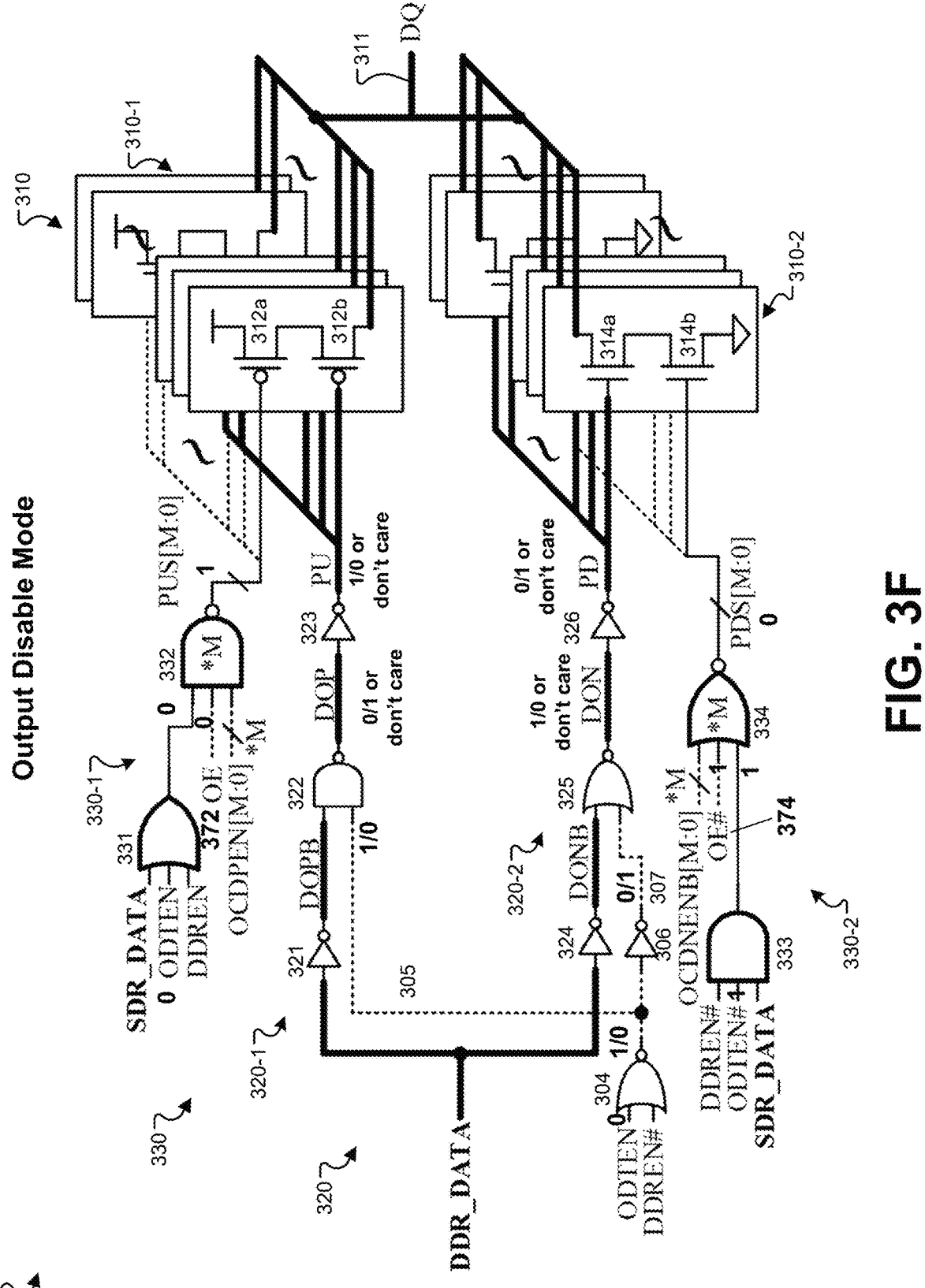
FIG. 3F illustrates Output Disable mode of the data output buffer of FIGS. 3A-3B, according to one or more implementations of the present disclosure.

As discussed with further details in FIGS. 3C-3F, the data output buffer 300 (or the first control signal 305 and the second control signal 307) are configured to perform at least one of: i) allowing to output the DDR data if the first interface is selected to receive the DDR data 302 (e.g., as illustrated in FIG. 3C), ii) keeping a respective p-type transistor 312b coupled to the first logic subcircuit 320-1 on and a respective n-type transistor 314a coupled to the second logic subcircuit 320-2 on if the second interface is selected to receive the SDR data 303 (e.g., as illustrated in FIG. 3D) or in response to receiving an on die termination (ODT) enable signal for enabling an ODT mode (e.g., as illustrated in FIG. 3E), or iii) keeping the respective p-type transistor 312a coupled to the third logic subcircuit 330-1 off and the respective n-type transistor 314b coupled to the fourth logic subcircuit 330-2 off in response to receiving an output disable signal for disabling the data output 311 of the driving circuit 310 (e.g., as illustrated in FIG. 3F).

As noted above, the second logic circuit 330 for SDR data 303 includes the third logic subcircuit 330-1 coupled between the second interface and the one or more first driving subcircuits 310-1 and the fourth logic subcircuit 330-2 coupled between the second interface and the one or more second driving subcircuits 310-2. As described with further details below, the second logic circuit 330 can include more complicated logic gates or components than the first logic circuit 320, such that the data output buffer 300 can implement all of DDR mode, SDR mode, ODT mode, and Output Disable mode (or OCD mode). In such a way, DDR data 302 can be transferred with a higher speed along the higher speed data path 328 through the data output buffer 300, e.g., than sharing a same data path with SDR data 303.

In some embodiments, e.g., as illustrated in FIG. 3B, the third logic subcircuit 330-1 includes an OR gate 331 and a second NAND gate 332 that are coupled between the second interface and the one or more first driving subcircuits 310-1. The OR gate 331 has a first input for receiving the SDR data 303 from the second interface, a second input for receiving an ODT enable (ODTEN) signal, a third input for receiving a DDR enable (DDREN) signal, and an output. The second NAND gate 332 has a first input coupled to the output for the OR gate 331, a second input for receiving an output enable (OE) signal, a third input for receiving a first selection signal (e.g., OCDPEN[M:0] as shown in FIG. 3B), and an output coupled to a respective p-type transistor 312a coupled to the third logic subcircuit 330-1 in each of the one or more first driving subcircuits 310-1.

In some embodiments, e.g., as illustrated in FIG. 3B, the fourth logic subcircuit 330-2 includes: an AND gate 333 and a second NOR gate 334 that are coupled in series between the second interface and the one or more second driving subcircuits 310-2. The AND gate 333 has a first input for receiving the SDR data 303 from the second interface, a second input for receiving an inversion of the ODT enable (ODTEN#) signal, a third input for receiving an inversion of the DDR enable (e.g., DDREN#) signal, and an output. The second NOR gate 334 has a first input coupled to the output of the AND gate 333, a second input for receiving an inversion of the OE (OE#) signal, a third input for receiving a second selection signal (e.g., OCDNENB[M:0] as shown in FIG. 3B), and an output coupled to a respective n-type transistor 314b coupled to the fourth logic subcircuit 330-2 in each of the one or more second driving subcircuits 310-2. The ODTEN# signal can be obtained by using an inverter to invert the ODT enable (ODTEN) signal. The OE# signal can be obtained by using an inverter to invert the OE signal. The second selection signal can be an inversion of the first selection signal or be controlled independently from the first selection signal.

As discussed with further details in FIGS. 3C-3F, the data output buffer 300 is configured to perform at least one of: i) allowing to output the SDR data if the second interface is selected to receive the SDR data 303 (e.g., as illustrated in FIG. 3D), ii) keeping a respective p-type transistor 312a coupled to the third logic subcircuit 330-1 on and a respective n-type transistor 314b coupled to the fourth logic subcircuit 330-2 on if the first interface is selected to receive the DDR data 302 (e.g., as illustrated in FIG. 3C) or in response to receiving the ODT enable signal (ODTEN) for enabling the ODT mode (e.g., as illustrated in FIG. 3E) and the output enable (OE) signal with a higher voltage level, or iii) keeping the respective p-type transistor 312a coupled to the third logic subcircuit 330-1 off and the respective n-type transistor 314b coupled to the fourth logic subcircuit 330-2 off in response to receiving the output disable signal for disabling the data output 311 of the driving circuit 310 (e.g., as illustrated in FIG. 3F). The output disable signal can be the output enable signal with a lower voltage level.

In some embodiments, e.g., as illustrated in FIG. 3B, the driving circuit 310 includes a plurality of first driving subcircuits 310-1 coupled in parallel with the supply voltage and the data output 311 and a plurality of second driving subcircuits 310-2 coupled in parallel with the data output 311 and the electrical ground. The plurality of second driving subcircuits 310-2 can correspond to the plurality of first driving subcircuits 310-1. In some examples, e.g., as shown in FIG. 3B, the number of the second driving subcircuits 310-2 (e.g., M) is identical to the number of the first driving subcircuits 310-1 (e.g., M), where M can be an integer larger than 1. In some examples, the number of the second driving subcircuits 310-2 (e.g., N) is different from (e.g., greater or smaller) the number of the first driving subcircuits 310-1 (e.g., M), where N can be an integer larger than 1. For illustration purposes, in the following, the number of the first driving subcircuits 310-1 and the number of the second driving subcircuits 310-2 are identical to M.

The second NAND gate 332 is configured to receive the first selection signal OCDPEN [M:0] and output data PUS [M:0] for selecting one or more first driving subcircuits 310-1 for data transfer among the M first driving subcircuits 310-1. The second NOR gate 334 is configured to receive the second selection signal OCDNENB [M:0] and output data PDS [M:0] for selecting one or more second driving subcircuits 310-2 for the data transfer among the M second driving subcircuits 310-2. The one or more second driving subcircuits 310-2 can correspond to the one or more first driving subcircuits 310-1. For example, the number of the selected one or more second driving subcircuits 310-2 is identical to the number of the selected one or more first driving subcircuits 310-1. The second selection signal OCDNENB[M:0] can be an inversion of the first selection signal OCDPEN [M:0]. Note that the first logic circuit 320 for DDR data 302 does not include logic gates for receiving the first selection signal or the second selection signal, which is simpler than the second logic circuit 330. For DDR data transfer, the first logic subcircuit 320-1 can be conductively coupled to each of the M first driving subcircuits 310-1, and the second logic subcircuit 320-2 can be conductively coupled to each of the M second driving subcircuits 310-2.

In some embodiments, each of the first selection signal and the second selection signal is associated with a predetermined impedance for the driving circuit 310. The predetermined impedance for the driving circuit 310 can be based on a combination of the one or more first driving subcircuits 310-1 and the one or more second driving subcircuits 310-2. In some embodiments, the semiconductor device receives a command from the controller. The command can include information indicating the predetermined impedance for the driving circuit 310, e.g., based on a loading coupled to the data output buffer 300. For example, the command can include a set value for the predetermined impedance. Based on the set value in the command, the semiconductor device can select the one or more first driving subcircuits 310-1 and the one or more second driving subcircuits 310-2. In some embodiments, the driving circuit 310 is configured to provide a series of impedances, and the controller can select one of the series of impedances to be included in the command. The controller can be configured to test different impedances to match the loading of the data output buffer 300 to identify an impedance that can provide a highest transfer speed for data transfer.

In the following, operations of the data output buffer 300 are described in view of FIGS. 3C-3F, showing the data output buffer 300 in DDR mode, SDR mode, ODT mode, and Output Disable mode, respectively. Table 1 also shows the operations of the data output buffer 300 under the four modes, where "1" and "0" correspond to a higher voltage level and a lower voltage level, respectively. Note that the ODTEN signal, the DDREN signal, the OE signal, OCDPEN[M:0] signal, and the OCDNENB[M:0] signal can be provided by the semiconductor device (e.g., the control logic 204 in the memory device 200 of FIG. 2) to the data output buffer 300. Each of the DDREN# signal, the ODTEN# signal, and the OE# signal can be obtained by using an inverter to invert the corresponding DDREN signal, the ODTEN signal, or the OE signal, respectively.

driving subcircuits 310-2 and a higher voltage level "1" for one or more other unselected second driving subcircuits 310-2. Accordingly, the data PUS[M:0] has a constant value "0" to turn on the p-type transistor 312a in each of the one or more first driving subcircuits 310-1, and the data PDS [M:0] has a constant value "1" to turn on the n-transistor 314b in each of the one or more second driving subcircuits 310-2.

When DDR data 342 (either "1" or "0") is transferred through the data output buffer 300, the data output buffer 300 outputs the DDR data 344 at the data output 311 of the driving circuit 310, having the same value as the DDR data 342. For example, with ODTEN being "0" and DDREN# being "0", the additional NOR gate 304 outputs the first control signal 305 with a higher voltage level "1". The second control signal 307 has a lower voltage level "0". Thus, the first NAND gate 322 outputs data DOP having the same value of DDR data 342, and the first NOR gate 325 outputs data DON having the same value of DDR data 342. Accordingly, the second inverter 323 outputs data PU with an inversion of the DDR data 342, and the fourth inverter 326 outputs data PD having the inversion of the DDR data 342.

When DDR data 342 is "1", the data PU is "0" and the data PD is "0", the p-type transistor 312b coupled to the first logic subcircuit 320-1 is turned on, while the n-type transistor 314a coupled to the second logic subcircuit 320-2 is turned off. As the p-type transistor 312a is on, the data output 311 is conductively coupled to the supply voltage and isolated from the electrical ground, thus providing a higher voltage level corresponding to "1", same as the DDR data 342. Similarly, when DDR data 342 is "0", the data PU is "1" and the data PD is "1", the p-type transistor 312b coupled to the first logic subcircuit 320-1 is turned off, while the n-type transistor 314a coupled to the second logic subcircuit 320-2 is turned on. As the n-type transistor 314b is on, the data output 311 is conductively coupled to the electrical ground and isolated from the supply voltage, thus providing a lower voltage level corresponding to "0", same as the DDR data 342.

TABLE 1

| | | | | | Operations of Data Output Buffer | | | | | |
| --- | --- | --- | --- | --- | --- | --- | --- | --- | --- | --- |
| Mode | DDREN | ODTEN | OE | OCDPEN | OCDNENB | PUS(*M) | PDS(*M) | PU | PD | DQ |
| DDR | 1 | 0 | 1 | 1 | 0 | 0 | 1 | DDR_DATA# | DDR_DATA# | DDR_DATA |
| | | | | 0 | 1 | 1 | 0 | | | |
| SDR | 0 | 0 | 1 | 1 | 0 | SDR_DATA# | SDR_DATA# | 0 | 1 | SDR_DATA |
| | | | | 0 | 1 | 1 | 0 | | | |
| ODT | don't care | 1 | 1 | 1 | 0 | 0 | 1 | 0 | 1 | Termination |
| | | | | 0 | 1 | 1 | 0 | | | |
| Output Disable | don't care | 0 | 0 | don't care | don't care | 1 | 0 | don't care | don't care | Floating |

55

FIG. 3C illustrates DDR data transfer 340 in the data output buffer 300 of FIGS. 3A-3B, according to one or more implementations of the present disclosure. As shown in Table 1 and FIG. 3C, at DDR mode, the DDREN signal has a higher voltage level "1", the ODTEN signal has a lower voltage level "0", and the output enable (OE) signal has a higher voltage level "1". The first selection signal OCDPEN [M:0] has a higher voltage level "1" for one or more selected first driving subcircuits 310-1 and a lower voltage level "0" for one or more other unselected first driving subcircuits 310-1. The second selection signal OCDNENB[M:0] has a lower voltage level "0" for one or more selected second FIG. 3D illustrates SDR data transfer 350 in the data output buffer 300 of FIGS. 3A-3B, according to one or more implementations of the present disclosure. When SDR data 352 (either "1" or "0") is transferred through the data output buffer 300, the data output buffer 300 outputs the SDR data 354 at the data output 311 of the driving circuit 310, having the same value as the SDR data 352.

As shown in Table 1 and FIG. 3D, at SDR mode, the DDREN signal has a lower voltage level "0", the ODTEN signal has a lower voltage level "0", and the output enable (OE) signal has a higher voltage level "1". The first selection signal OCDPEN[M:0] has a higher voltage level "1" for one or more selected first driving subcircuits 310-1 and a lower voltage level "0" for other unselected first driving subcircuits 310-1. The second selection signal OCDNENB[M:0] has a lower voltage level "0" for one or more selected second driving subcircuits 310-2 and a higher voltage level "1" for other unselected second driving subcircuits 310-2. Thus, with ODTEN being "0", DDREN being "0", and OE being "1", e.g., as shown in Table 1, the data PUS[M:0] has a value "1" to turn off the p-type transistor 312a in each of the other unselected first driving subcircuits 310-1, and the data PDS [M:0] has a value "0" to turn off the n-transistor 314b in each of the other unselected second driving subcircuits 310-2. In contrast, the data PUS[M:0] has an inverted value of the SDR data 352 for the one or more selected first driving subcircuits 310-1, and the data PDS [M:0] has an inverted value of the SDR data 352 for the one or more selected second driving subcircuits 310-2.

Additionally, with ODTEN being "0" and DDREN# being "1", the additional NOR gate 304 outputs the first control signal 305 with a lower voltage level corresponding to "0". Thus, the first NAND gate 322 outputs data DOP having a value of "1" and the second inverter 323 outputs data PU having a value of "0" to turn on the p-type transistor 312b in each of the one or more first driving subcircuits 310-1. Similarly, the second control signal 307 has a higher voltage level "1", and thus the first NOR gate 325 outputs data DON having "0" and the fourth inverter 326 outputs data PD having "1" to turn on the n-type transistor 314a in each of the one or more second driving subcircuits 310-2.

When SDR data 352 is "1", the p-type transistor 312a in each of the one or more selected first driving subcircuits 310-1 is turned on, while the n-type transistor 314b in each of the one or more selected second driving subcircuits 310-2 is turned off. As the p-type transistor 312b is on, the data output 311 is conductively coupled to the supply voltage and isolated from the electrical ground, thus providing the output SDR data 354 having a higher voltage level corresponding to "1", same as the SDR data 352. Similarly, when SDR data 352 is "0", the p-type transistor 312a in each of the one or more selected first driving subcircuits 310-1 is turned off, while the n-type transistor 314b in each of the one or more selected second driving subcircuits 310-2 is turned on. As the n-type transistor 314a is on, the data output 311 is conductively coupled to the electrical ground and isolated from the supply voltage, thus providing the output SDR data 354 having a lower voltage level corresponding to "0", same as the SDR data 352.

FIG. 3E illustrates ODT mode 360 of the data output buffer 300 of FIGS. 3A-3B, according to one or more implementations of the present disclosure. The ODT mode can be enabled by the semiconductor device, e.g., based on a command from the controller.

In the ODT mode, the ODTEN signal 362 has a higher voltage level "1", and the data output buffer 300 is configured to turn on the p-type transistors 312a, 312b in the one or more first driving subcircuits 310-1 and the n-type transistors 314a, 314b in the one or more second driving subcircuits 310-2, such that a current flow path 364 is formed from the supply voltage through the driving circuit 310 to the electrical ground. Thus, the data output 311 of the driving circuit 310 can be terminated.

In some embodiments, as illustrated in Table 1 and FIG. 3E, to enable the ODT mode, the ODTEN signal has a higher voltage level "1", and the OE signal has a higher voltage level "1". There can be no input for SDR data and DDR data. It does not care what the DDREN signal is. Accordingly, the data PU has a lower voltage level "0" to turn on the p-type transistor 312b in each of the one or more first driving subcircuits 310-1, and the data PD has a higher voltage level "1" to turn on the n-type transistor 314a in each of the one or more second driving subcircuits 310-2. The first selection signal OCDPEN[M:0] has a value "1" for one or more selected first driving subcircuits 310-1 and a value "0" for one or more other unselected first driving subcircuits 310-1. Accordingly, the p-type transistor 312a in each of the one or more selected first driving subcircuits 310-1 is turned on and the p-type transistor 312a in each of the one or more other unselected first driving subcircuit 310-1 is turned off. Similarly, the second selection signal OCDNENB[M:0] has a value "0" for one or more selected second driving subcircuits 310-2 and a value "1" for one or more other unselected second driving subcircuits 310-2. Accordingly, the n-type transistor 314b in each of the one or more selected second driving subcircuits 310-2 is turned on and the n-type transistor 314b in each of the one or more other unselected second driving subcircuit 310-2 is turned off. In such a way, the current flow path 364 can be formed from the supply voltage through the one or more selected first driving subcircuits 310-1 and the one or more selected second driving subcircuits 310-2 to the electrical ground.

FIG. 3F illustrates Output Disable mode 370 of the data output buffer 300 of FIGS. 3A-3B, according to one or more implementations of the present disclosure. The Output Disable mode can be enabled (or activated) by the semiconductor device, e.g., based on a command from the controller.

To enable the Output Disable mode, the ODTEN signal has a lower voltage level "0", the OE signal 372 has a lower voltage level "0" and the OE# signal 374 has a higher voltage level "1". It does not care for other signals, including DDREN signal, OCDPEN[M:0] signal, and OCDNENB[M: 0] signal. As illustrated in Table 1 and FIG. 3F, the data PUS[M:0] has a higher voltage level "1" and the data PU has a higher voltage level "1", thus, the p-type transistors 312a, 312b in each of the one or more first driving subcircuits 310-1 are both turned off. Similarly, the data PDS[M:0] has a lower voltage level "0" and the data PD has a lower voltage level "0", thus, the n-type transistors 314a, 314b in each of the one or more second driving subcircuits 310-2 are both turned off. Therefore, there is no output at the data output 311, or the data output 311 is floating.

Figure 4A:
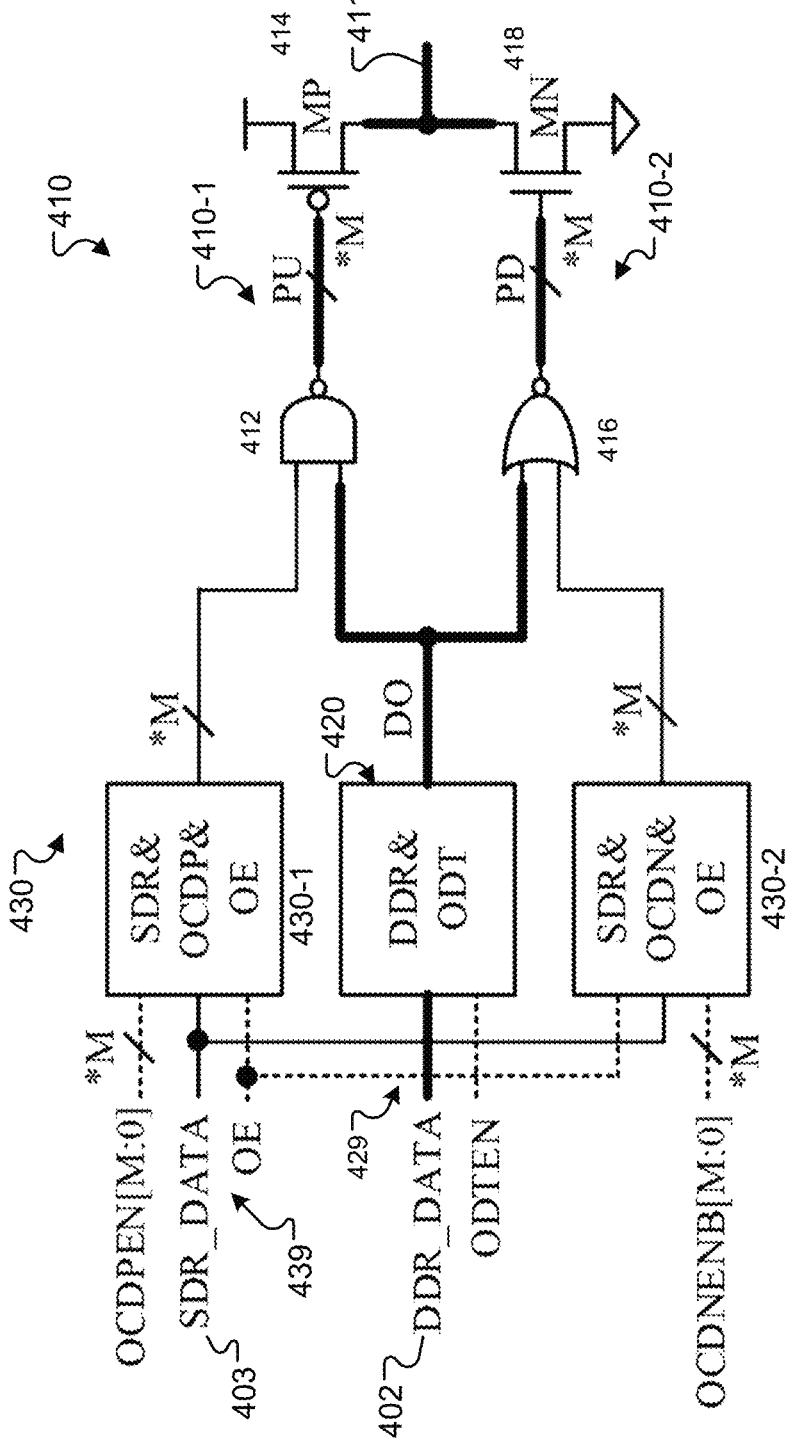
FIG. 4A is a schematic diagram of another example data output buffer for SDR and DDR data transfers, according to one or more implementations of the present disclosure.
Figure 4B:
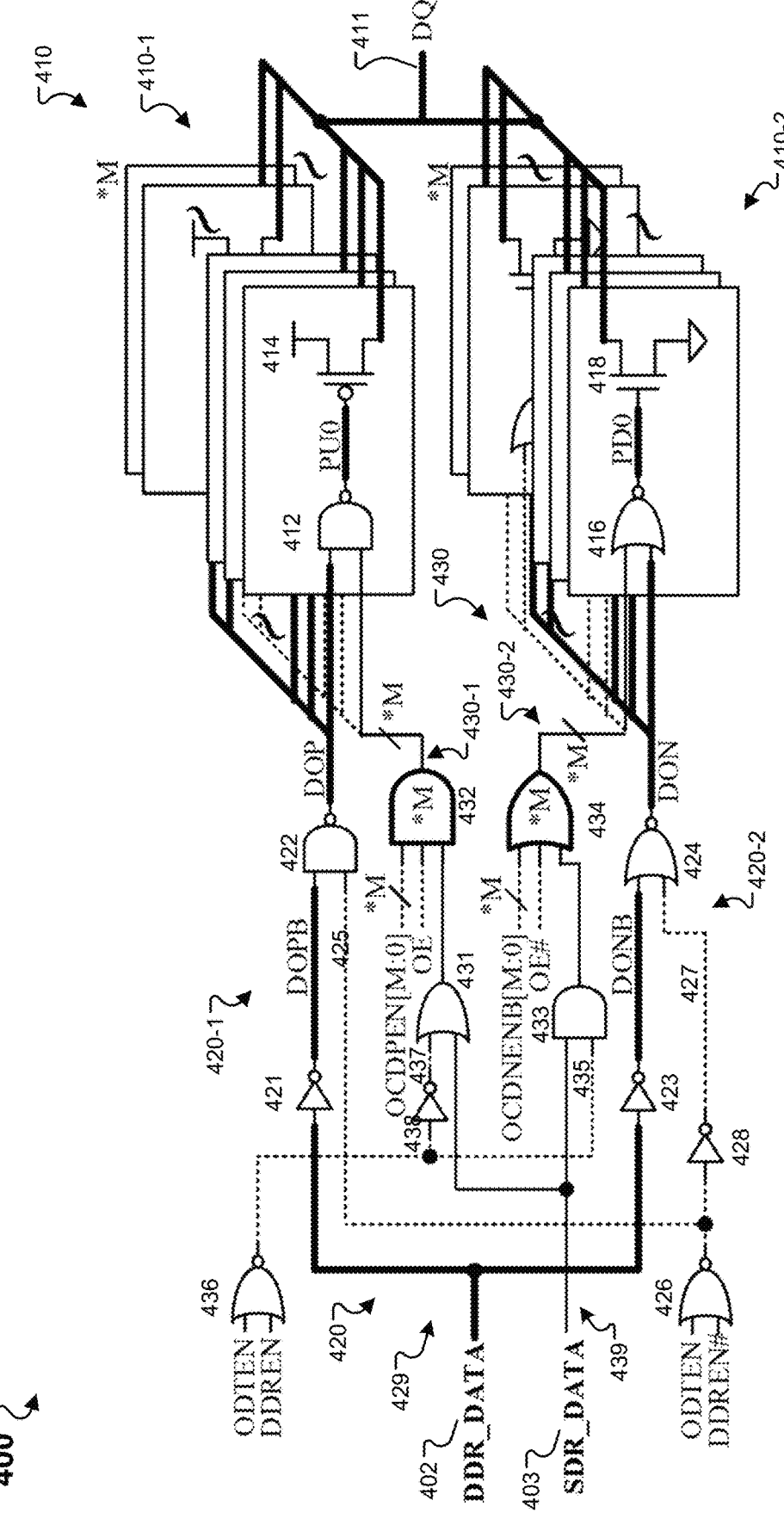
FIG. 4B is an example circuit diagram of the data output buffer of FIG. 4A, according to one or more implementations of the present disclosure.

FIGS. 4A-4B show another example data output buffer 400 for SDR and DDR data transfers in a semiconductor device, according to one or more implementations of the present disclosure. The semiconductor device can be the memory 116 of FIG. 1 or the memory device 200 of FIG. 2. The data output buffer 400 can be implemented as the data output buffer 244 of FIG. 2. The data output buffer 400 can be coupled between a data storage circuit such as a data cache circuit (e.g., the data cache circuit 230 of FIG. 2) in the semiconductor device and a device interface (e.g., the memory interface 202 of FIG. 2) of the semiconductor device. The data output buffer 400 can be configured to transfer data stored or cached in the data storage circuit through the device interface to a controller (e.g., the device controller 112 or the host controller 122 of FIG. 1). FIGS. 4C to 4F illustrate the data output buffer 400 in DDR data transfer mode, SDR data transfer mode, ODT mode, and Output Disable mode, respectively.

As discussed with further details in FIGS. 4A-4F, similar to the data output buffer 300 of FIGS. 3A-3F, the data output buffer 400 includes a first interface for receiving DDR data 402, a second interface for receiving SDR data 403, a first logic circuit 420 coupled to the first interface, and a second logic circuit 430 coupled to the second interface. Thus, the data output buffer 400 does not need to include a multiplexer, similar to the data output buffer 300. However, different from the data output buffer 300, the first logic circuit 420 and the second logic circuit 430 in the data output buffer 400 are coupled to same logic gates and transistors in a driving circuit 410. That is, the DDR data transfer and the SDR data transfer share the same data path through the driving circuit 410. Thus, the data output buffer 400 can include less logic gates or components than the data output buffer 300, though a higher speed path for DDR data transfer may experience more complicated logic gates or components in the data output buffer 400 than the higher speed path for DDR data transfer in the data output buffer 300.

FIG. 4A is a schematic diagram of the example data output buffer 400 for SDR and DDR data transfers, according to one or more implementations of the present disclosure. FIG. 4B is an example circuit diagram of the data output buffer 400 of FIG. 4A, according to one or more implementations of the present disclosure. The data output buffer 400 separates the higher speed data path 429 (as illustrated as thick lines in FIGS. 4A-4F) for DDR data transfer and a lower speed data path 439 for SDR data transfer, and simplifies logic circuits on the higher speed data path 429 to increase a transfer speed of the DDR data transfer. Also, with the separated data paths 429, 439, the data output buffer 400 can have no multiplexer to separate SDR data and DDR data from input interfaces, which can further simplify the logic circuits on the higher speed data path 429 to further increase the transfer speed of the DDR data transfer.

In some embodiments, the data output buffer 400 includes the first interface (e.g., DDR interface) for receiving DDR data (or DDR_DATA) 402 and the second interface (e.g., SDR interface) for receiving SDR data (or SDR_DATA) 403. Each of the first interface and the second interface can be respectively coupled to the data storage circuit. In some embodiments, the semiconductor device is configured to receive a command from the controller. The command can include information for selecting one of DDR mode (or DDR interface) and the SDR mode (or SDR interface) for data transfer following the command. If the DDR mode or DDR interface is indicated in the command, the semiconductor device can be configured to transfer storage data (or cached data) in the data storage circuit out as DDR data to the first interface of the data output buffer 400, e.g., by transferring data at both a falling edge and a rising edge of a clock signal at a clock frequency. If the SDR mode or SDR interface is indicated in the command, the semiconductor device can be configured to transfer storage data (or cached data) in the data storage circuit out as SDR data to the second interface of the data output buffer 400, e.g., by transferring data at a falling edge or a rising edge of the clock signal at the clock frequency.

The data output buffer 400 includes the first logic circuit 420 coupled to the first interface to receive the DDR data 402 and the second logic circuit 430 coupled to the second interface to receive the SDR data 403. The data output buffer 400 also includes the driving circuit 410 separately coupled to the first logic circuit 420 and the second logic circuit 430. The driving circuit 410 includes a data output (data output node or data queue—DQ) 411 for outputting data corresponding to the DDR data 402 or data corresponding to the SDR data 403, e.g., to the device interface. The first interface, the first logic circuit 420, and the driving circuit 410 can be arranged in series to form the higher speed data path 429 to transfer the DDR data 402 with a first speed. The second interface, the second logic circuit 430, and the driving circuit 410 can be arranged in series to form the lower speed data path 439 to transfer the SDR data 403 with a second speed. The first speed can be higher than the second speed, e.g., more than 100%, 120%, 150%, or twice. As discussed with further details below, the first logic circuit 420 and the second logic circuit 430 can be configured to cause data to be transferred through the first logic circuit 420 with a higher speed than through the second logic circuit 430, e.g., by including a smaller number of logic gates or transistors in the first logic circuit 420 than in the second logic circuit 430.

In some embodiments, e.g., as illustrated in FIGS. 4A-4B, the driving circuit 410 includes one or more first driving subcircuits 410-1 each having at least one first-type transistor and one or more second driving subcircuits 410-2 each having at least one second-type transistor. The first-type transistor can be a p-type transistor such as p-channel metal-oxide-semiconductor (PMOS) transistor, and the second-type transistor can be an n-type transistor such as n-channel metal-oxide-semiconductor (NMOS) transistor. The one or more first driving subcircuits 410-1 are coupled between a supply voltage (e.g., VDD) and the data output 411, and the one or more second driving subcircuits 410-2 are coupled between the data output 411 and an electrical ground (e.g., VSS or 0 V).

The first logic circuit 420 for the DDR data 402 can include a first logic subcircuit 420-1 coupled to the one or more first driving subcircuits 410-1 and a second logic subcircuit 420-2 coupled to the one or more second driving subcircuits 410-2. The second logic circuit 430 for the SDR data 403 can include a third logic subcircuit 430-1 coupled to the one or more first driving subcircuits 410-1 and a fourth logic subcircuit 430-2 coupled to the one or more second driving subcircuits 410-2.

In some embodiments, e.g., as illustrated in FIG. 4B, each of the one or more first driving subcircuits 410-1 includes a first NAND gate 412 and a p-type transistor 414 that are coupled in series between the first logic circuit 420 and the second logic circuit 430 and the data output 411. The first NAND gate 412 has a first input coupled to the first logic subcircuit 420-1, a second input coupled to the third logic subcircuit 430-1, and an output coupled to a gate of the p-type transistor 414. The p-type transistor 414 is coupled between a supply voltage (e.g., VDD) and the data output 411. Each of the one or more second driving subcircuits 410-2 includes a first NOR gate 416 and an n-type transistor 418 that are coupled in series between the first logic circuit 420 and the second logic circuit 430 and the data output 411. The first NOR gate 416 has a first input coupled to the second logic subcircuit 420-2, a second input coupled to the fourth logic subcircuit 430-2, and an output coupled to a gate of the n-type transistor 418. The n-type transistor 418 is coupled between the data output 411 and an electrical ground (e.g., VSS or 0 V).

In some embodiments, e.g., as illustrated in FIG. 4B, the first logic subcircuit 420-1 includes a first inverter 421 and a second NAND gate 422 that are coupled in series between the first interface and the one or more first driving subcircuits 410-1. The first inverter 421 is configured to invert the DDR data 402 from the first interface and output inverted DDR data DOPB. The second NAND gate 422 has a first input for receiving the inverted DDR data DOPB from the first inverter 421, a second input for receiving a first control signal 425, and an output for outputting data DOP to the first input of the first NAND gate 412 in each of the one or more first driving subcircuits 410-1. The second logic subcircuit 420-2 includes a second inverter 423 and a second NOR gate

424 that are coupled in series between the first interface and the one or more second driving subcircuits 410-2. The second inverter 423 is configured to invert the DDR data 402 from the first interface and output inverted DDR data DONB. The second NOR gate 424 has a first input for receiving the inverted DDR data DONB from the second inverter 423, a second input for receiving a second control signal 427, and an output for outputting data DON to the first input of the first NOR gate 416 in each of the one or more second driving subcircuits 410-2.

In some embodiments, the first logic circuit 420 includes an additional first NOR gate 426 having a first input for receiving an ODT enable (ODTEN) signal, a second input for receiving an inverted DDR enable (DDREN#) signal, and an output for outputting the first control signal 425 to the second input of the second NAND gate 422. The first logic circuit 420 can also include an additional inverter 428 coupled to the output of the additional first NOR gate 426 and configured to invert the first control signal 425 and output the second control signal 427 to the second input of the second NOR gate 424. The second control signal 427 can be an inversion of the first control signal 425. In some embodiments, at least one of the additional first NOR gate 426 or the additional inverter 428 can be arranged in the data output buffer 400 and out of the first logic circuit 420.

Figure 4C:
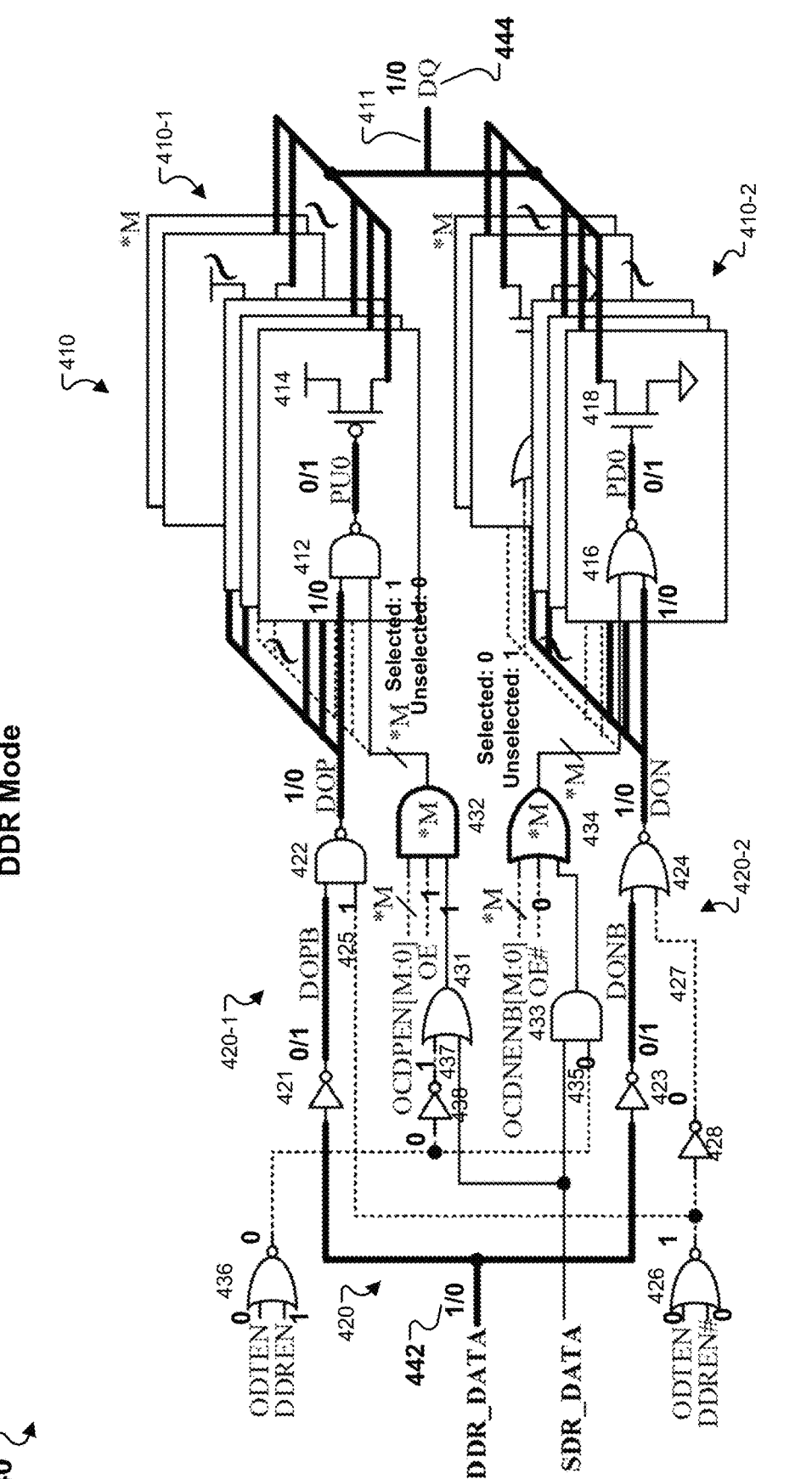
FIG. 4C illustrates DDR data transfer in the data output buffer of FIGS. 4A-4B, according to one or more implementations of the present disclosure.
Figure 4D:
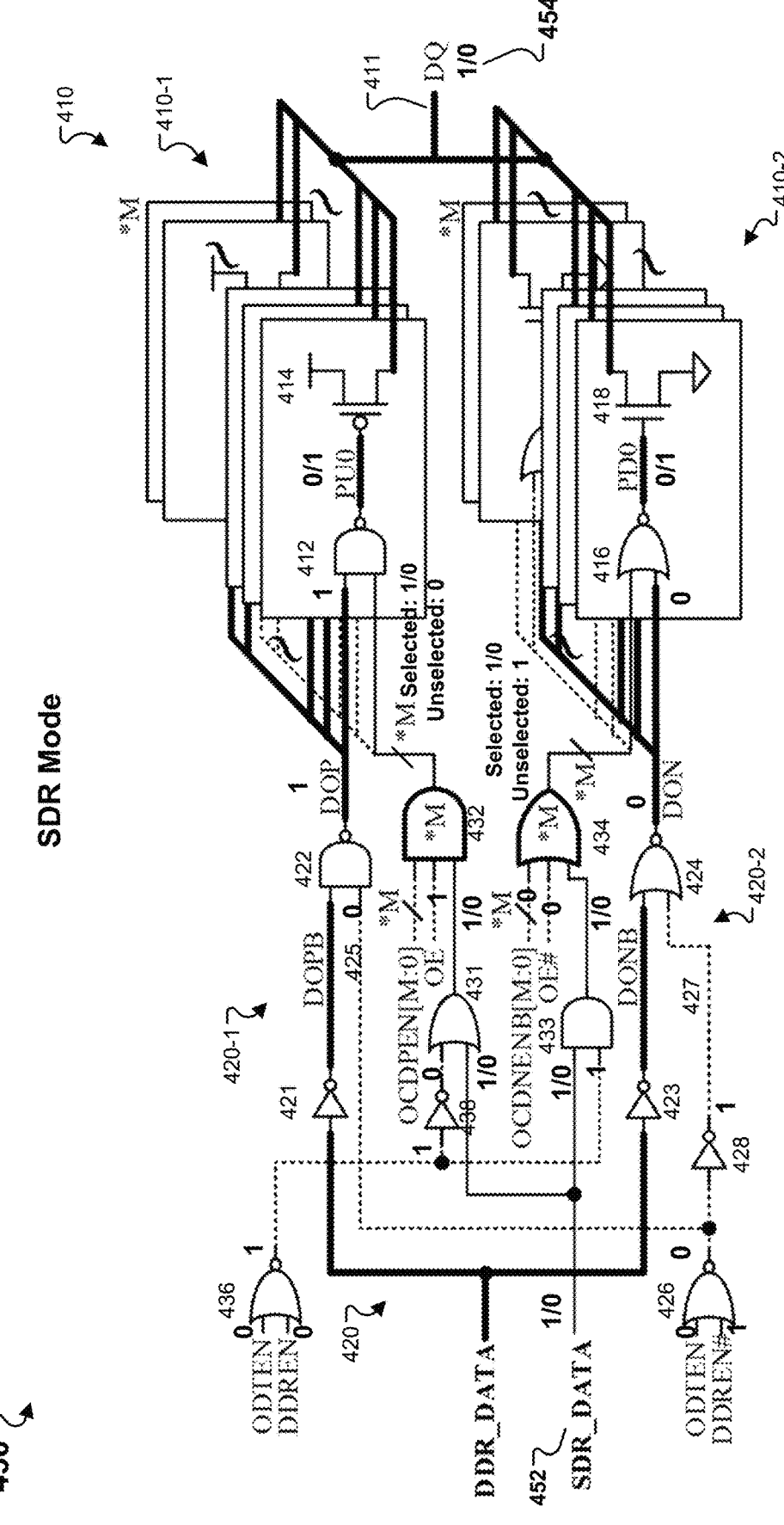
FIG. 4D illustrates SDR data transfer in the data output buffer of FIGS. 4A-4B, according to one or more implementations of the present disclosure.
Figure 4E:
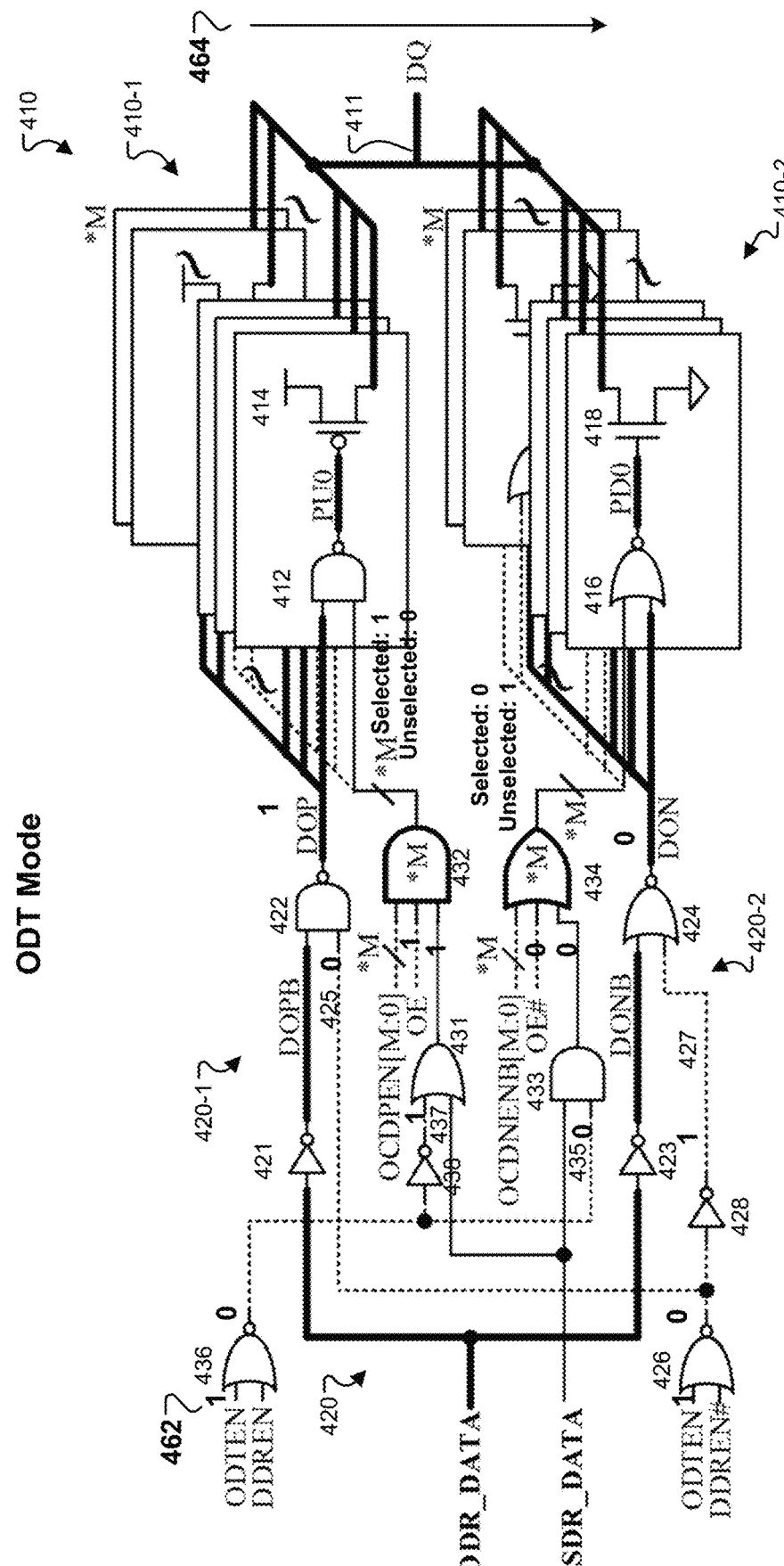
FIG. 4E illustrates ODT mode of the data output buffer of FIGS. 4A-4B, according to one or more implementations of the present disclosure.

As discussed with further details in FIGS. 4C-4E, the first control signal 425 and the second control signal 427 are configured to perform at least one of: i) allowing to output the DDR data 402 if the first interface is selected to receive the DDR data (e.g., as illustrated in FIG. 4C), or ii) keeping the output of the second NAND gate 422 to be "1" and the output of the second NOR gate 424 to be "0" if the second interface is selected to receive the lower-speed-type data (e.g., as illustrated in FIG. 4D) or in response to receiving an on die termination (ODT) enable signal for enabling an ODT mode (e.g., as illustrated in FIG. 4E).

In some embodiments, the second logic circuit 430 includes an additional second NOR gate 436 having a first input for receiving the ODTEN signal, a second input for receiving a DDR enable (DDREN) signal, and an output for outputting a third control signal 435. In some embodiments, the additional second NOR gate 436 can be also included in the data output buffer 400 but out of the second logic circuit 430.

In some embodiments, e.g., as illustrated in FIG. 4B, the third logic subcircuit 430-1 in the second logic circuit 430 includes a first OR gate 431 and a first AND gate 432 that are coupled in series between the second interface and the one or more first driving subcircuits 410-1. The third logic subcircuit 430-1 can further include a third inverter 438 having an input coupled to the output of the additional second NOR gate 436 for receiving the third control signal 435 and an output for outputting an inverted third control signal 437 to the first OR gate 431. The first OR gate 431 has a first input coupled to the output of the third inverter 438 for receiving the inverted third control signal 437, a second input coupled to the second interface for receiving the SDR data 403, and an output coupled to the first AND gate 432. The first AND gate 432 has a first input coupled to the output of the first OR gate 431, a second input for receiving an output enable (OE) signal, a third input for receiving a selection signal OCDPEN[M:0], and an output coupled to the second input of the first NAND gate 412 in each of the one or more first driving subcircuits 410-1.

In some embodiments, as illustrated in FIG. 4B, the fourth logic subcircuit 430-2 in the second logic circuit 430 includes a second AND gate 433 and a second OR gate 434 that are coupled in series between the second interface and the one or more second driving subcircuits 410-2. The second AND gate 433 has a first input coupled to the second interface for receiving the SDR data, a second input coupled to the output of the additional second NOR gate 436 for receiving the third control signal 435, and an output coupled to the second OR gate 434. The second OR gate 434 has a first input coupled to the output of the second AND gate 433, a second input for receiving an inversion of the OE signal (OE#), a third input for receiving a second selection signal OCDNENB[M:0], and an output coupled to the second input of the first NOR gate 416 in each of the one or more second driving subcircuits 410-2.

As discussed with further details in FIGS. 4C-4F, the data output buffer 400 is configured to perform at least one of i) allowing to output the SDR data 403 if the second interface is selected to receive the SDR data 403 (e.g., as illustrated in FIG. 4D), ii) keeping the output of the first AND gate 432 to be "1" and the output of the second OR gate 434 to be "0" if the first interface is selected to receive the DDR data (e.g., as illustrated in FIG. 4C) or in response to receiving the ODTEN signal for enabling the ODT mode and the OE signal with a higher voltage level (e.g., as illustrated in FIG. 4E), or iii) keeping the output of the first AND gate 432 to be "0" and the output of the second OR gate 434 to be "1" in response to receiving an output disable signal for disabling the data output 411 of the driving circuit 410. The output disable signal can be the output enable (OE) signal with a lower voltage level "0".

In some embodiments, e.g., as illustrated in FIG. 4B, the driving circuit 410 includes M first driving subcircuits 410-1 coupled in parallel with the supply voltage and the data output 411 and M second driving subcircuits 410-2 coupled in parallel with the data output 411 and the electrical ground. The M second driving subcircuits 410-2 can correspond to the M first driving subcircuits 410-1. M can be an integer larger than 1. For example, the number of the second driving subcircuits 410-2 (e.g., M) is identical to the number of the first driving subcircuits 410-1 (e.g., M).

The first AND gate 432 is configured to receive the first selection signal OCDPEN [M:0] and output data for selecting one or more first driving subcircuits 410-1 for data transfer among the M first driving subcircuits 410-1. The second OR gate 434 is configured to receive the second selection signal OCDNENB [M:0] and output data for selecting one or more second driving subcircuits 410-2 for the data transfer among the M second driving subcircuits 410-2. The one or more second driving subcircuits 410-2 can correspond to the one or more first driving subcircuits 410-1. For example, the number of the selected one or more second driving subcircuits 410-2 is identical to the number of the selected one or more first driving subcircuits 410-1. The second selection signal OCDNENB[M:0] can be an inversion of the first selection signal OCDPEN [M:0]. Note that the first logic circuit 420 for DDR data 402 does not include logic gates for receiving the first selection signal or the second selection signal, which is simpler than the second logic circuit 430.

In some embodiments, each of the first selection signal and the second selection signal is associated with a predetermined impedance for the driving circuit 410. The predetermined impedance for the driving circuit 410 can be based on a combination of the selected one or more first driving subcircuits 410-1 and the selected one or more second driving subcircuits 410-2. In some embodiments, the semiconductor device receives a command from the controller. The command can include information indicating the predetermined impedance for the driving circuit 410, e.g., based on a loading coupled to the data output buffer 400. For example, the command can include a set value for the predetermined impedance. Based on the set value in the command, the semiconductor device can select the one or more first driving subcircuits 410-1 and the one or more second driving subcircuits 410-2. In some embodiments, the driving circuit 410 is configured to provide a series of impedances, and the controller can select one of the series of impedances to be included in the command. The controller can be configured to test different impedances to match the loading of the data output buffer 400 to identify an impedance that can provide a highest transfer speed for data transfer.

In the following, operations of the data output buffer 400 are described in view of FIGS. 4C-4F, showing the data output buffer 400 in DDR mode, SDR mode, ODT mode, and Output Disable mode, respectively. Table 1 also shows the operations of the data output buffer 300 under the four modes, where "1" and "0" correspond to a higher voltage level and a lower voltage level, respectively. Note that the ODTEN signal, the DDREN signal, the OE signal, OCDPEN[M:0] signal, and the OCDNENB[M:0] signal can be provided by the semiconductor device (e.g., the control logic 204 in the memory device 200 of FIG. 2) to the data output buffer 400. The DDREN# signal can be obtained by using an inverter to invert the corresponding DDREN signal, and the OE# signal can be obtained by using an inverter to invert the corresponding the OE signal.

level corresponding to "0". Thus, the second NAND gate 422 outputs data DOP having the same value of DDR data 442, and the second NOR gate 424 outputs data DON having the same value of DDR data 442.

Accordingly, for the one or more selected first driving subcircuits 410-1, the first NAND gate 412 outputs data PUO with an inversion of the DDR data 442, and the p-type transistor 414 is turned on when the DDR data 442 has a value "1" and turned off when the DDR data 442 has a value "0". Similarly, for the one or more selected second driving subcircuits 410-2, the first NOR gate 416 outputs data PD having the inversion of the DDR data 442, and the n-type transistor 418 is turned off when the DDR data 442 has a value "1" and turned on when the DDR data 442 has a value "0". Therefore, when the DDR data 442 has a value "1", the p-type transistor 414 coupled to the supply voltage is turned on and the n-type transistor 418 coupled to the electrical ground is turned off. Thus, the data output 411 is conductively coupled to the supply voltage and isolated from the electrical ground, providing a higher voltage level corresponding to "1", same as the DDR data 442. Similarly, when DDR data 442 has a value "0", the p-type transistor 414 coupled to the supply voltage is turned off and the n-type transistor 418 coupled to the electrical ground is turned on. Thus, the data output 411 is conductively coupled to the electrical ground and isolated from the supply voltage, providing a lower voltage level corresponding to "0", same as the DDR data 442.

TABLE 2

| | | | | OCDPEN | OCDNENB | | | |
|---|---|---|---|---|---|---|---|---|
| Mode | DDREN | ODTEN | OE | [M:0] | [M:0] | PU (*M) | PD (*M) | DQ |
| DDR | 1 | 0 | 1 | 1 | 0 | DDR_DATA# | DDR_DATA# | DDR_DATA |
| | | | | 0 | 1 | 1 | 0 | |
| SDR | 0 | 0 | 1 | 1 | 0 | SDR_DATA# | SDR_DATA# | SDR_DATA |
| | | | | 0 | 1 | 1 | 0 | |
| ODT | don't care | 1 | 1 | 1 | 0 | 0 | 1 | Termination |
| | | | | 0 | 1 | 1 | 0 | |
| Output Disable | don"t care | 0 | 0 | don't care | don't care | 1 | 0 | floating |

Operations of Data Output Buffer

FIG. 4C illustrates DDR data transfer 440 in the data output buffer 400 of FIGS. 4A-4B, according to one or more implementations of the present disclosure. As shown in Table 2 and FIG. 4C, at DDR mode, the DDREN signal has a higher voltage level "1", the ODTEN signal has a lower voltage level "0", and the output enable (OE) signal has a higher voltage level "1". The first selection signal OCDPEN [M:0] has a higher voltage level "1" for one or more selected first driving subcircuits 410-1 and a lower voltage level "0" for other unselected first driving subcircuits 410-1. The second selection signal OCDNENB[M:0] has a lower voltage level "0" for one or more selected second driving subcircuits 410-2 and a higher voltage level "1" for other unselected second driving subcircuits 410-2.

When DDR data 442 (either "1" or "0") is transferred through the data output buffer 400, the data output buffer 400 outputs the DDR data 444 at the data output 411 of the driving circuit 410, having the same value as the DDR data 442. For example, with ODTEN being "0" and DDREN# being "0", the additional first NOR gate 426 outputs the first control signal 425 with a higher voltage level corresponding to "1". The second control signal 427 has a lower voltage FIG. 4D illustrates SDR data transfer 450 in the data output buffer 400 of FIGS. 4A-4B, according to one or more implementations of the present disclosure. When SDR data 452 (either "1" or "0") is transferred through the data output buffer 400, the data output buffer 400 outputs the SDR data 454 at the data output 411 of the driving circuit 410, having the same value as the SDR data 452.

As shown in Table 2 and FIG. 4D, at SDR mode, the DDREN signal has a lower voltage level "0", the ODTEN signal has a lower voltage level "0", and the output enable (OE) signal has a higher voltage level "1". The first selection signal OCDPEN[M:0] has a higher voltage level "1" for one or more selected first driving subcircuits 410-1 and a lower voltage level "0" for other unselected first driving subcircuits 410-1. The second selection signal OCDNENB[M:0] has a lower voltage level "0" for one or more selected second driving subcircuits 410-2 and a higher voltage level "1" for other unselected second driving subcircuits 410-2. Thus, with ODTEN being "0", DDREN being "0", and OE being "1", e.g., as shown in Table 2, the first AND gate 432 outputs the SDR data 452 for the one or more selected first driving subcircuits 410-1 and "0" for the other unselected first driving subcircuits 410-1, and the second OR gate 434 outputs the SDR data 452 for the one or more selected second driving subcircuits 410-2 and "1" for the other unselected second driving subcircuits 410-2.

Additionally, with ODTEN being "0" and DDREN# being "1", the additional first NOR gate 426 outputs the first control signal 425 with a lower voltage level corresponding to "0". Thus, the second NAND gate 422 outputs data DOP having "1". The additional inverter 428 receives the first control signal 425 and outputs the second control signal 427 with a higher voltage level "1". Thus, the second NOR gate 424 outputs data DON having "0".

Accordingly, with the DOP being "1", for the one or more selected first driving subcircuits 410-1, the first NAND gate 412 outputs data PUO with an inversion of the SDR data 452, and the p-type transistor 414 is turned on when the SDR data 452 has a value "1" and turned off when the SDR data 452 has a value "0". Similarly, with DON being "0", for the one or more selected second driving subcircuits 410-2, the first NOR gate 416 outputs data PD having the inversion of the SDR data 452, and the n-type transistor 418 is turned off when the SDR data 452 has a value "1" and turned on when the SDR data 452 has a value "0". Therefore, when the SDR data 452 has a value "1", the p-type transistor 414 coupled to the supply voltage is turned on and the n-type transistor 418 coupled to the electrical ground is turned off. Thus, the data output 411 is conductively coupled to the supply voltage and isolated from the electrical ground, providing a higher voltage level corresponding to "1", same as the SDR data 452. Similarly, when SDR data 452 has a value "0", the p-type transistor 414 coupled to the supply voltage is turned off and the n-type transistor 418 coupled to the electrical ground is turned on. Thus, the data output 411 is conductively coupled to the electrical ground and isolated from the supply voltage, providing a lower voltage level corresponding to "0", same as the SDR data 452.

FIG. 4E illustrates ODT mode 460 of the data output buffer 400 of FIGS. 4A-4B, according to one or more implementations of the present disclosure. In the ODT mode, the ODTEN signal 462 has a higher voltage level corresponding to value "1", and the data output buffer 400 is configured to turn on the p-type transistor 414 in the one or more first driving subcircuits 410-1 and the n-type transistor 418 in the one or more second driving subcircuits 410-2, such that a current flow path 464 is formed from the supply voltage through the driving circuit 410 to the electrical ground. Thus, the data output 411 of the driving circuit 410 is terminated.

In some embodiments, as illustrated in Table 2 and FIG. 4E, to enable the ODT mode, the ODTEN signal has a higher voltage level "1", and the OE signal has a higher voltage level "1". There can be no input for SDR data and DDR data. It does not care what the DDREN signal is. Accordingly, the second NAND gate 422 outputs DOP having a higher voltage level "1", and the first AND gate 432 outputs data identical to the first selection signal OCDPEN[M:0], that is, "1" for the one or more selected first driving subcircuits 410-1 and "0" for the other unselected first driving subcircuits 410-1. Thus, the first NAND 412 outputs data PUO having a lower voltage level "0" for the one or more selected first driving circuits 410-1 and a higher voltage level "1" for the other unselected first driving circuits 410-1. Accordingly, the p-type transistor 414 in each of the one or more selected first driving subcircuits 410-1 is turned on and the p-type transistor 414 in each of the other unselected first driving subcircuits 410-1 is turned off.

Similarly, with the ODTEN having the higher voltage level "1", the second NOR gate 424 outputs DON with a lower voltage level "0", and the second OR gate 434 outputs data identical to the second selection signal OCDNENB[M: 0], that is, "0" for the one or more selected second driving subcircuits 410-2 and "1" for the other unselected second driving subcircuits 410-2. Thus, the first NOR 416 outputs data PDO having a higher voltage level "1" for the one or more selected second driving circuits 410-2 and a lower voltage level "0" for the other unselected second driving circuits 410-2. Accordingly, the n-type transistor 418 in each of the one or more selected second driving subcircuits 410-2 is turned on and the n-type transistor 418 in each of the other unselected second driving subcircuits 410-2 is turned off. In such a way, the driving circuit 410 can have a predetermined impedance and the current flow path 464 can be formed from the supply voltage through the one or more first driving subcircuits 410-1 and the one or more second driving subcircuits 410-2 to the electrical ground.

Figure 4F:
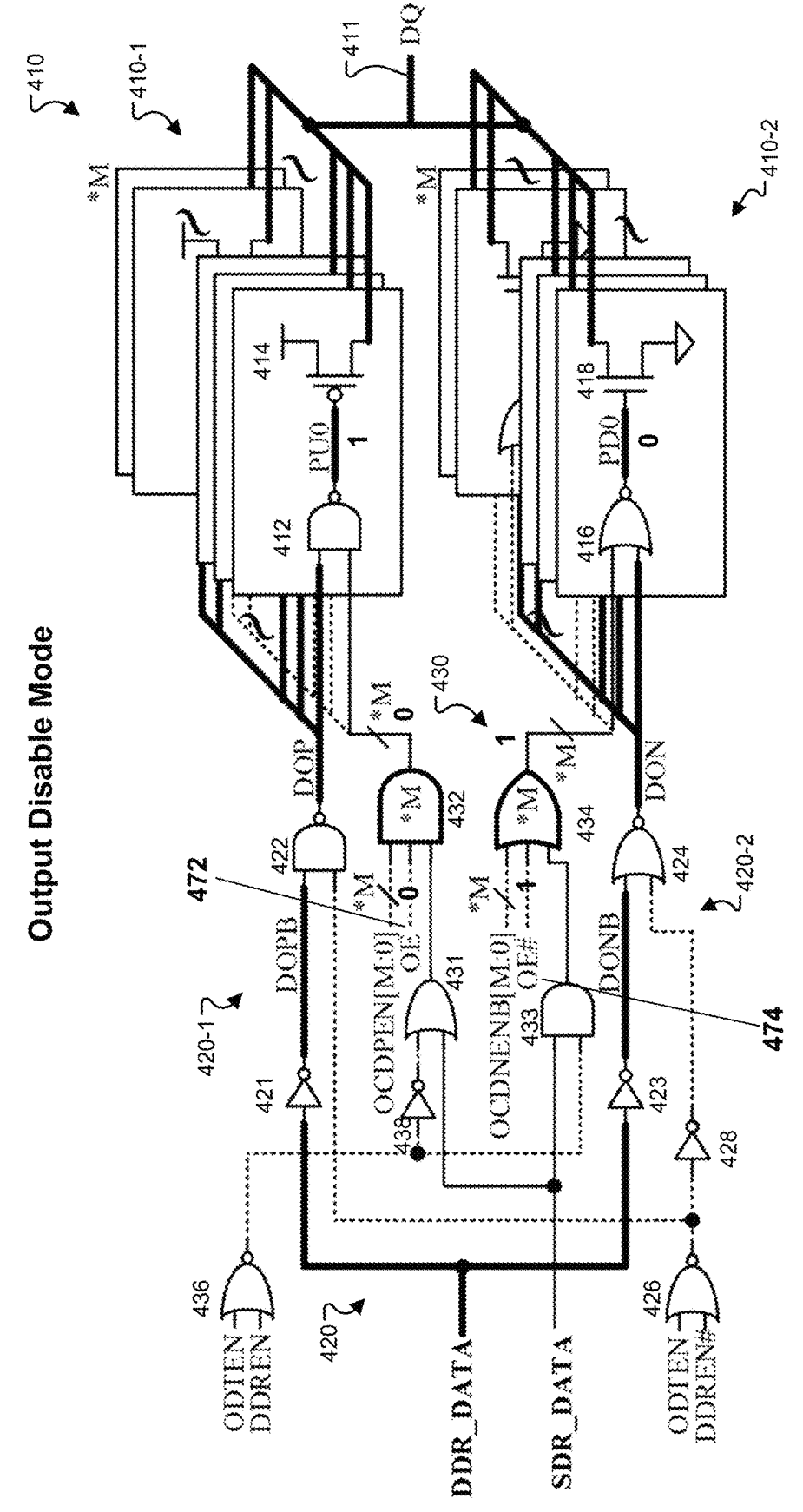
FIG. 4F illustrates Output Disable mode of the data output buffer of FIG. 4A-4B, according to one or more implementations of the present disclosure.

FIG. 4F illustrates Output Disable mode 470 of the data output buffer 400 of FIGS. 4A-4B, according to one or more implementations of the present disclosure. To enable the Output Disable mode, the OE signal 472 has a lower voltage level "0" and the OE# signal 474 has a higher voltage level "1". It does not care for other signals, including ODTEN signal, DDREN signal, OCDPEN[M:0] signal, and OCD-NENB[M:0] signal. As illustrated in Table 2 and FIG. 4F, the data PUO has a higher voltage level "1", thus, the p-type transistor 414 in each of the one or more first driving subcircuits 410-1 is turned off. Similarly, the data PDO has a lower voltage level "0", thus, the n-type transistor 418 in each of the one or more second driving subcircuits 410-2 is turned off. Therefore, there is no output at the data output 411, or the data output 411 is floating.

Example Process

FIG. 5 is a flow chart of an example process 500 of managing data transfers in a semiconductor device, according to one or more implementations of the present disclosure. The semiconductor device can be the memory 116 of FIG. 1 or the memory device 200 of FIG. 2. The semiconductor device can include a data output buffer, e.g., the data output buffer 244 of FIG. 2, the data output buffer 300 of FIGS. 3A-3F, or the data output buffer 400 of FIGS. 4A-4F.

In some embodiments, the semiconductor device includes a data storage circuit such as a data cache circuit (e.g., the data cache circuit 230 of FIG. 2) and a device interface (e.g., the memory interface 202 of FIG. 2). The semiconductor device can include a memory cell array (e.g., the memory cell array 210 of FIG. 2) for storing data. During a read operation, data can be read out from the memory cell array and cached in the data storage circuit. The data output buffer can be coupled between the data storage circuit and the device interface. The data output buffer can be configured to transfer data stored or cached in the data storage circuit through the device interface to a controller (e.g., the device controller 112 or the host controller 122 of FIG. 1).

The process 500 can be performed by the semiconductor device. As shown in FIG. 5, the process 500 can include subprocess 510 for transferring higher-speed-type data and subprocess 520 for transferring lower-speed-type data. In some embodiments, the higher-speed-type data includes double data rate (DDR) data and the lower-speed-type data includes single data rate (SDR) data. In some embodiments, the higher-speed-type data includes quad data rate (QDR) data and the lower-speed-type data includes SDR data or DDR data. Subprocess 510 and subprocess 520 can be performed in any suitable order. Each subprocess 510, 520 can include one or more steps.

For subprocess 510, at step 512, a first interface is selected to receive higher-speed-type data. The first interface can be selected by the semiconductor device based on a command received from the controller. The command can indicate which interface to be selected for data transfer following the command. The semiconductor can include the first interface for receiving the higher-speed-type data and a second interface for receiving the lower-speed-type data. Based on the command, the semiconductor device can transfer data stored or cached in the data storage circuit as the higher-speed-type data or the lower-speed-type data.

At step 514, the higher-speed-type data is transferred with a first speed along a first data path from the first interface through a first logic circuit to a driving circuit. The first logic circuit can be the first logic circuit 320 in FIGS. 3A-3F or the first logic circuit 420 in FIGS. 4A-4F. The driving circuit can be the driving circuit 310 in FIGS. 3A-3F or 410 in FIGS. 4A-4F. The first data path can be the higher speed data path 328 in FIGS. 3A-3F or 429 in FIGS. 4A-4F.

At step 516, the higher-speed-type data is outputted at a data output of the driving circuit, e.g., to the device interface. The data output can be the data output 311 of FIGS. 3A-3F or 411 of FIGS. 4A-4F.

For subprocess 520, at step 522, the second interface is selected to receive lower-speed-type data, e.g., based on a command from the controller. At step 524, the lower-speed-type data is transferred with a second speed along a second data path from the second interface through a second logic circuit to the driving circuit. The second logic circuit can be the second logic circuit 330 in FIGS. 3A-3F or the second logic circuit 430 in FIGS. 4A-4F. The second data path can be the higher speed data path 338 in FIGS. 3A-3F or 439 in FIGS. 4A-4F. At step 526, the lower-speed-type data is outputted at the data output of the driving circuit, e.g., to the device interface. The data output can be the data output 311 of FIGS. 3A-3F or 411 of FIGS. 4A-4F.

In some embodiments, the first logic circuit and the second logic circuit are configured to cause data to be transferred through the first logic circuit with a higher speed than through the second logic circuit. In some embodiments, the first logic circuit includes a smaller number of logic gates or transistors than the second logic circuit.

In some embodiments, the driving circuit includes one or more first driving subcircuits (e.g., 310-1 of FIGS. 3A-3F or 410-1 of FIGS. 4A-4F) each including at least one first-type transistor, and one or more second driving subcircuits (e.g., 310-2 of FIGS. 3A-3F or 410-2 of FIGS. 4A-4F) each including at least one second-type transistor. The first logic circuit can include a first logic subcircuit (e.g., 320-1 of FIGS. 3A-3F or 420-1 of FIGS. 4A-4F) coupled to the one or more first driving subcircuits and a second logic subcircuit (e.g., 320-2 of FIGS. 3A-3F or 420-2 of FIGS. 4A-4F) coupled to the one or more second driving subcircuits. The second logic circuit can include a third logic subcircuit (e.g., 330-1 of FIGS. 3A-3F or 430-1 of FIGS. 4A-4F) coupled to the one or more first driving subcircuits and a fourth logic subcircuit (e.g., 330-2 of FIGS. 3A-3F or 430-2 of FIGS. 4A-4F) coupled to the one or more second driving subcircuits. The first-type transistor can include a p-type transistor (e.g., PMOS transistor), and the second-type transistor can include an n-type transistor (e.g., NMOS transistor). The one or more first driving subcircuits can be coupled between a supply voltage and the data output, and the one or more second driving subcircuits can be coupled between the data output and an electrical ground.

In some embodiments, e.g., as illustrated in FIGS. 3A-3F, each of the one or more first driving subcircuits (e.g., 310-1 of FIG. 3B) includes two first-type transistors (e.g., the p-type transistors 312a, 312b of FIG. 3B) coupled in series between the supply voltage and the data output, and each of the first logic subcircuit (e.g., 320-1 of FIG. 3B) and the third logic subcircuit (e.g., 330-1 of FIG. 3B) is coupled to a respective first-type transistor (e.g., 312b, 312a of FIG. 3B) of the two first-type transistors in each of the one or more first driving subcircuits. Each of the one or more second driving subcircuits (e.g., 310-2 of FIG. 3B) can include two second-type transistors (e.g., 314a, 314b of FIG. 3B) coupled in series between the data output and the electrical ground, and each of the second logic subcircuit (e.g., 320-2 of FIG. 3B) and the fourth logic subcircuit (e.g., 330-2 of FIG. 3B) is coupled to a respective second-type transistor (e.g., 314a, 314b of FIG. 3B) of the two second-type transistors in each of the one or more second driving subcircuits.

In some embodiments, the second logic circuit is configured such that, if the first interface is selected to receive the higher-speed-type data, the respective first-type transistor coupled to the third logic subcircuit and the respective second-type transistor coupled to the fourth logic subcircuit are turned on, and the driving circuit outputs the data corresponding to the higher-speed-type data at the data output, e.g., as illustrated in FIG. 3C. The first logic circuit is configured such that, if the second interface is selected to receive the lower-speed-type data, the respective first-type transistor coupled to the first logic subcircuit and the respective second-type transistor coupled to the second logic subcircuit are turned on, and the driving circuit outputs the data corresponding to the lower-speed-type data at the data output, e.g., as illustrated in FIG. 3D.

In some embodiments, each of the two first-type transistors includes a p-type transistor, and each of the two second-type transistors includes an n-type transistor. The first logic subcircuit includes a first NAND gate (e.g., 322 of FIGS. 3B-3F) having a first input for receiving inverted higher-speed-type data and a second input for receiving a first control signal (e.g., 305 of FIG. 3B). The second logic subcircuit includes a first NOR gate (e.g., 325 of FIGS. 3B-3F) having a first input for receiving the inverted higher-speed-type data and a second input for receiving a second control signal (e.g., 307 of FIG. 3B).

In some embodiments, the first control signal and the second control signal are configured to perform at least one of: i) allowing to output the higher-speed-type data if the first interface is selected to receive the higher-speed-type data (e.g., as illustrated in FIG. 3C), ii) keeping a respective p-type transistor coupled to the first logic subcircuit on and a respective n-type transistor coupled to the second logic subcircuit on if the second interface is selected to receive the lower-speed-type data (e.g., as illustrated in FIG. 3D) or in response to receiving an on die termination (ODT) enable signal for enabling an ODT mode (e.g., as illustrated in FIG. 3E), or iii) keeping the respective p-type transistor coupled to the first logic subcircuit off and the respective n-type transistor coupled to the second logic subcircuit off in response to receiving an output disable signal for disabling the data output of the driving circuit (e.g., as illustrated in FIG. 3F).

In some embodiments, the first logic circuit further includes: an additional NOR gate (e.g., 304 of FIG. 3B) having a first input for receiving the ODT enable signal (e.g., ODTEN of FIG. 3B), a second input for receiving an inverted higher-speed-type enable signal (e.g., DDREN# of FIG. 3B), and an output for outputting the first control signal to the second input of the first NAND gate, and an additional inverter (e.g., 306 of FIG. 3B) configured to receive the first control signal from the output of the additional NOR gate and output the second control signal (e.g., 307 of FIG. 3B) to the second input of the first NOR gate, the second control signal being an inversion of the first control signal.

In some embodiments, the first logic subcircuit further includes: a first inverter (e.g., 321 of FIGS. 3B-3F) configured to receive the higher-speed-type data from the first interface and output the inverted higher-speed-type data to the first input of the first NAND gate, and a second inverter (e.g., 323 of FIGS. 3B-3F) having an input coupled to an output of the first NAND gate and an output coupled to the respective p-type transistor coupled to the first logic subcircuit in each of the one or more first driving subcircuits. The second logic subcircuit can further include: a third inverter (e.g., 324 of FIGS. 3B-3F) configured to receive the higher-speed-type data from the first interface and output the inverted higher-speed-type data to the first input of the first NOR gate, and a fourth inverter (e.g., 326 of FIGS. 3B-3F) having an input coupled to an output of the first NOR gate and an output coupled to the respective n-type transistor coupled to the second logic subcircuit in each of the one or more second driving subcircuits.

In some embodiments, the third logic subcircuit (e.g., 330-1 of FIG. 3B) includes: an OR gate (e.g., 331 of FIG. 3B) having a first input for receiving the lower-speed-type data from the second interface, a second input for receiving an ODT enable signal, a third input for receiving a higher-speed-type enable signal (e.g., DDREN of FIG. 3B), and an output, and a second NAND gate (e.g., 332 of FIG. 3B) having a first input coupled to the output for the OR gate, a second input for receiving an output enable signal (e.g., OE of FIG. 3B), and an output coupled to a respective p-type transistor (e.g., 312a of FIG. 3B) coupled to the third logic subcircuit in each of the one or more first driving subcircuits. The fourth logic subcircuit can include: an AND gate (e.g., 333 of FIG. 3B) having a first input for receiving the lower-speed-type data from the second interface, a second input for receiving an inversion of the ODT enable signal, a third input for receiving an inversion of the higher-speed-type enable signal, and an output, and a second NOR gate (e.g., 334 of FIG. 3B) having a first input coupled to the output of the AND gate, a second input for receiving an inversion of the output enable signal, and an output coupled to a respective n-type transistor coupled to the fourth logic subcircuit in each of the one or more second driving subcircuits.

In some embodiments, the data output buffer is configured to perform at least one of: i) allowing to output the lower-speed-type data if the second interface is selected to receive the lower-speed-type data (e.g., as illustrated in FIG. 3D), ii) keeping a respective p-type transistor coupled to the third logic subcircuit on and a respective n-type transistor coupled to the fourth logic subcircuit on if the first interface is selected to receive the higher-speed-type data (e.g., as illustrated in FIG. 3C) or in response to receiving the ODT enable signal for enabling the ODT mode and the output enable signal with a higher voltage level (e.g., as illustrated in FIG. 3E), or iii) keeping the respective p-type transistor coupled to the third logic subcircuit off and the respective n-type transistor coupled to the fourth logic subcircuit off in response to receiving the output disable signal for disabling the data output of the driving circuit (e.g., as illustrated in FIG. 3F). The output disable signal can be the output enable signal with a lower voltage level.

In some embodiments, the driving circuit includes a plurality of first driving subcircuits coupled in parallel with the supply voltage and the data output and a plurality of second driving subcircuits coupled in parallel with the data output and the electrical ground. The plurality of second driving subcircuits can correspond to the plurality of first driving subcircuits. The second NAND gate can include a third input for receiving a first selection signal (e.g., OCDPEN[M:0]) for selecting one or more first driving subcircuits for data transfer among the plurality of first driving subcircuits. The second NOR gate includes a third input for receiving a second selection signal for selecting one or more second driving subcircuits for the data transfer among the plurality of second driving subcircuits. The one or more second driving subcircuits can correspond to the one or more first driving subcircuits. The second selection signal can be an inversion of the first selection signal or be controlled independently from the first selection signal. Each of the first selection signal and the second selection signal can be associated with a predetermined impedance for the driving circuit, and the predetermined impedance for the driving circuit can be based on a combination of the one or more first driving subcircuits and the one or more second driving subcircuits.

In some embodiments, e.g., as illustrated in FIGS. 4A-4F, in the driving circuit (e.g., 410 of FIGS. 4A-4F), each of the one or more first driving subcircuits (e.g., 410-1 of FIGS. 4A-4F) includes: a first-type transistor (e.g., the p-type transistor 414 of FIGS. 4A-4F) coupled between the supply voltage and the data output, and a first NAND gate (e.g., 412 of FIGS. 4A-4F) having a first input coupled to the first logic subcircuit, a second input coupled to the third logic subcircuit, and an output coupled to the first-type transistor. Each of the one or more second driving subcircuits (e.g., 410-2 of FIGS. 4A-4F) can include: a second-type transistor (e.g., the n-type transistor 418 of FIGS. 4A-4F) coupled between the data output and the electrical ground, and a first NOR gate (e.g., 416 of FIGS. 4A-4F) having a first input coupled to the second logic subcircuit, a second input coupled to the fourth logic subcircuit, and an output coupled to the second-type transistor.

In some embodiments, the first logic subcircuit includes: a first inverter (e.g., 421 of FIGS. 4B-4F) configured to invert the higher-speed-type data from the first interface, and a second NAND gate (e.g., 422 of FIGS. 4B-4F) having a first input for receiving the inverted higher-speed-type data from the first inverter, a second input for receiving a first control signal (e.g., 425 of FIG. 4B), and an output coupled to the first input of the first NAND gate in each of the one or more first driving subcircuits. The second logic subcircuit includes: a second inverter (e.g., 423 of FIGS. 4B-4F) configured to invert the higher-speed-type data from the first interface, and a second NOR gate (e.g., 424 of FIGS. 4B-4F) having a first input for receiving the inverted higher-speed-type data from the second inverter, a second input for receiving a second control signal (e.g., 427 of FIG. 4B), and an output coupled to the first input of the first NOR gate in each of the one or more second driving subcircuits.

In some embodiments, the first control signal and the second control signal are configured to perform at least one of: i) allowing to output the higher-speed-type data if the first interface is selected to receive the higher-speed-type data (e.g., as illustrated in FIG. 4C), or ii) keeping the output of the second NAND gate to be "1" and the output of the second NOR gate to be "0" if the second interface is selected to receive the lower-speed-type data (e.g., as illustrated in FIG. 4D) or in response to receiving an on die termination (ODT) enable signal for enabling an ODT mode (e.g., as illustrated in FIG. 4E).

In some embodiments, the data output buffer further includes: an additional first NOR gate (e.g., 426 of FIGS. 4B-4F) having a first input for receiving the ODT enable signal, a second input for receiving an inverted higher-speed-type enable signal, and an output for outputting the first control signal to the second input of the second NAND gate, and an additional inverter (e.g., 428 of FIGS. 4B-4F) configured to receive the first control signal from the output of the additional first NOR gate and output the second control signal to the second input of the second NOR gate, the second control signal being an inversion of the first control signal. In some embodiments, the first logic circuit includes the additional first NOR gate and the additional inverter.

In some embodiments, the data output buffer further includes an additional second NOR gate (e.g., 436 of FIGS. 4B-4F) having a first input for receiving the ODT enable signal, a second input for receiving a higher-speed-type enable signal, and an output for outputting a third control signal (e.g., 435 of FIG. 4B).

In some embodiments, the third logic subcircuit includes: a third inverter (e.g., 438 of FIG. 4B) having an input coupled to the output of the additional second NOR gate for receiving the third control signal and an output for outputting an inverted third control signal (e.g., 437 of FIG. 4B), a first OR gate (e.g., 431 of FIGS. 4B-4F) having a first input coupled to the output of the third inverter for receiving the inverted third control signal, a second input coupled to the second interface for receiving the lower-speed-type data, and an output, and a first AND gate (e.g., 432 of FIGS. 4B-4F) having a first input coupled to the output of the first OR gate, a second input for receiving an output enable signal, and an output coupled to the second input of the first NAND gate in each of the one or more first driving subcircuits.

In some embodiments, the fourth logic subcircuit (e.g., 430-2 of FIG. 4B) includes a second AND gate (e.g., 433 of FIG. 4B) having a first input coupled to the second interface for receiving the lower-speed-type data, a second input coupled to the output of the additional second NOR gate for receiving the third control signal, and an output, and a second OR gate (e.g., 434 of FIG. 4B) having a first input coupled to the output of the second AND gate, a second input for receiving an inversion of the output enable signal, and an output coupled to the second input of the first NOR gate in each of the one or more second driving subcircuits.

In some embodiments, the data output buffer is configured to perform at least one of: i) allowing to output the lower-speed-type data if the second interface is selected to receive the lower-speed-type data (e.g., as illustrated in FIG. 4D), ii) keeping the output of the first AND gate to be "1" and the output of the second OR gate to be "0" if the first interface is selected to receive the higher-speed-type data (e.g., as illustrated in FIG. 4C) or in response to receiving the ODT enable signal for enabling the ODT mode and the output enable signal with a higher voltage level (e.g., as illustrated in FIG. 4E), or iii) keeping the output of the first AND gate to be "0" and the output of the second OR gate to be "1" in response to receiving an output disable signal for disabling the data output of the driving circuit (e.g., as illustrated in FIG. 4F). The output disable signal can be the output enable signal with a lower voltage level.

In some embodiments, the driving circuit includes a plurality of first driving subcircuits coupled in parallel with the supply voltage and the data output and a plurality of second driving subcircuits coupled in parallel with the data output and the electrical ground. The plurality of second driving subcircuits can correspond to the plurality of first driving subcircuits. The first AND gate can include a third input for receiving a first selection signal for selecting one or more first driving subcircuits for data transfer among the plurality of first driving subcircuits, and the second OR gate includes a third input for receiving a second selection signal for selecting one or more second driving subcircuits for the data transfer among the plurality of second driving subcircuits. The one or more second driving subcircuits can correspond to the one or more first driving subcircuits. The second selection signal can be an inversion of the first selection signal, or be controlled independently from the first selection signal.

In some embodiments, each of the first selection signal and the second selection signal is associated with a predetermined impedance for the driving circuit, and wherein the predetermined impedance for the driving circuit is based on a combination of the one or more first driving subcircuits and the one or more second driving subcircuits.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method comprising:

selecting a first interface to receive higher-speed-type data at a first clock frequency;

transferring the higher-speed-type data with a first speed along a first data path from the first interface through a first logic circuit to a driving circuit;

outputting the higher-speed-type data by the driving circuit;

selecting a second interface to receive lower-speed-type data at a second clock frequency that is same as the first clock frequency;

transferring the lower-speed-type data with a second speed along a second data path from the second interface through a second logic circuit to the driving circuit, the first speed being higher than the second speed; and outputting the lower-speed-type data by the driving circuit.

2. The method of claim 1, wherein the driving circuit comprises: one or more first driving subcircuits each comprising at least one first-type transistor, and one or more second driving subcircuits each comprising at least one second-type transistor, wherein the first logic circuit comprises a first logic subcircuit coupled to the one or more first driving subcircuits and a second logic subcircuit coupled to the one or more second driving subcircuits, and wherein the second logic circuit comprises a third logic subcircuit coupled to the one or more first driving subcircuits and a fourth logic subcircuit coupled to the one or more second driving subcircuits, and wherein the driving circuit comprises a data output, and wherein the one or more first driving subcircuits are coupled between a supply voltage and the data output, and the one or more second driving subcircuits are coupled between the data output and an electrical ground.

3. The method of claim 2, wherein each of the one or more first driving subcircuits comprises two first-type transistors coupled in series between the supply voltage and the data output, and wherein each of the first logic subcircuit and the third logic subcircuit is coupled to a respective first-type transistor of the two first-type transistors in each of the one or more first driving subcircuits, and wherein each of the one or more second driving subcircuits comprises two second-type transistors coupled in series between the data output and the electrical ground, and wherein each of the second logic subcircuit and the fourth logic subcircuit is coupled to a respective second-type transistor of the two second-type transistors in each of the one or more second driving subcircuits.

4. The method of claim 3, further comprising one of:

in response to selecting the first interface to receive the higher-speed-type data, turning on the respective first-type transistor coupled to the third logic subcircuit and the respective second-type transistor coupled to the fourth logic subcircuit, and outputting the data corresponding to the higher-speed-type data at the data output, or in response to selecting the second interface to receive the lower-speed-type data, turning on the respective first-type transistor coupled to the first logic subcircuit and the respective second-type transistor coupled to the second logic subcircuit, and outputting the data corresponding to the lower-speed-type data at the data output.

5. The method of claim 3, wherein the first logic subcircuit comprises a first NAND gate having a first input for receiving inverted higher-speed-type data and a second input for receiving a first control signal, and wherein the second logic subcircuit comprises a first NOR gate having a first input for receiving the inverted higher-speed-type data and a second input for receiving a second control signal.

6. The method of claim 5, further comprising at least one of:

i) enabling to output the higher-speed-type data based on the first control signal and the second control signal, if the first interface is selected to receive the higher-speed-type data, ii) based on the first control signal and the second control signal, keeping a respective first-type transistor coupled to the first logic subcircuit on and a respective second-type transistor coupled to the second logic subcircuit on, if the second interface is selected to receive the lower-speed-type data or in response to receiving an on die termination (ODT) enable signal for enabling an ODT mode, or iii) based on the first control signal and the second control signal, keeping the respective first-type transistor coupled to the third logic subcircuit off and the respective second-type transistor coupled to the fourth logic subcircuit off in response to receiving an output disable signal for disabling the data output of the driving circuit.

7. The method of claim 6, further comprising:
generating the first control signal based on the ODT enable signal and an inverted higher-speed-type enable signal using an additional NOR gate, wherein the additional NOR gate has a first input for receiving the ODT enable signal, a second input for receiving the inverted higher-speed-type enable signal, and an output for outputting the first control signal to the second input of the first NAND gate; and
generating the second control signal based on the first control signal by an additional inverter that receives the first control signal from the output of the additional NOR gate and outputs the second control signal to the second input of the first NOR gate, the second control signal being an inversion of the first control signal.

8. The method of claim 5, wherein the first logic subcircuit further comprises: a first inverter configured to receive the higher-speed-type data from the first interface and output the inverted higher-speed-type data to the first input of the first NAND gate, and a second inverter comprising an input coupled to an output of the first NAND gate and an output coupled to the respective first-type transistor coupled to the first logic subcircuit in each of the one or more first driving subcircuits, and
wherein the second logic subcircuit further comprises: a third inverter configured to receive the higher-speed-type data from the first interface and output the inverted higher-speed-type data to the first input of the first NOR gate, and a fourth inverter comprising an input coupled to an output of the first NOR gate and an output coupled to the respective second-type transistor coupled to the second logic subcircuit in each of the one or more second driving subcircuits.

9. The method of claim 5, wherein the third logic subcircuit comprises: an OR gate having a first input for receiving the lower-speed-type data from the second interface, a second input for receiving an ODT enable signal, a third input for receiving a higher-speed-type enable signal, and an output, and a second NAND gate having a first input coupled to the output for the OR gate, a second input for receiving an output enable signal, and an output coupled to a respective first-type transistor coupled to the third logic subcircuit in each of the one or more first driving subcircuits, and
wherein the fourth logic subcircuit comprises: an AND gate having a first input for receiving the lower-speed-type data from the second interface, a second input for receiving an inversion of the ODT enable signal, a third input for receiving an inversion of the higher-speedtype enable signal, and an output, and a second NOR gate having a first input coupled to the output of the AND gate, a second input for receiving an inversion of the output enable signal, and an output coupled to a respective second-type transistor coupled to the fourth logic subcircuit in each of the one or more second driving subcircuits.

10. The method of claim 9, further comprising at least one of:
i) enabling to output the lower-speed-type data if the second interface is selected to receive the lower-speed-type data,
ii) keeping a respective first-type transistor coupled to the third logic subcircuit on and a respective second-type transistor coupled to the fourth logic subcircuit on if the first interface is selected to receive the higher-speed-type data or in response to receiving the ODT enable signal for enabling the ODT mode and the output enable signal with a higher voltage level, or
iii) keeping the respective first-type transistor coupled to the third logic subcircuit off and the respective second-type transistor coupled to the fourth logic subcircuit off in response to receiving the output disable signal for disabling the data output of the driving circuit.

11. The method of claim 9, wherein the driving circuit comprises a plurality of first driving subcircuits coupled in parallel with the supply voltage and the data output and a plurality of second driving subcircuits coupled in parallel with the data output and the electrical ground,
wherein the second NAND gate comprises a third input for receiving a first selection signal for selecting one or more particular first driving subcircuits for data transfer among the plurality of first driving subcircuits,
wherein the second NOR gate comprises a third input for receiving a second selection signal for selecting one or more particular second driving subcircuits for the data transfer among the plurality of second driving subcircuits, and
wherein each of the first selection signal and the second selection signal is associated with a predetermined impedance for the driving circuit, and wherein the predetermined impedance for the driving circuit is based on a combination of the one or more particular first driving subcircuits and the one or more particular second driving subcircuits.

12. The method of claim 2, wherein each of the one or more first driving subcircuits comprises: a first-type transistor coupled between the supply voltage and the data output, and
a first NAND gate having a first input coupled to the first logic subcircuit, a second input coupled to the third logic subcircuit, and an output coupled to the first-type transistor, and
wherein each of the one or more second driving subcircuits comprises: a second-type transistor coupled between the data output and the electrical ground, and a first NOR gate having a first input coupled to the second logic subcircuit, a second input coupled to the fourth logic subcircuit, and an output coupled to the second-type transistor.

13. The method of claim 12, wherein the first logic subcircuit comprises: a first inverter configured to invert the higher-speed-type data from the first interface, and a second NAND gate having a first input for receiving the inverted higher-speed-type data from the first inverter, a second input for receiving a first control signal, and an output coupled to the first input of the first NAND gate in each of the one or more first driving subcircuits, and wherein the second logic subcircuit comprises: a second inverter configured to invert the higher-speed-type data from the first interface, and a second NOR gate having a first input for receiving the inverted higher-speed-type data from the second inverter, a second input for receiving a second control signal, and an output coupled to the first input of the first NOR gate in each of the one or more second driving subcircuits.

14. The method of claim 13, further comprising at least one of:

i) based on the first control signal and the second control signal, enabling to output the higher-speed-type data if the first interface is selected to receive the higher-speed-type data, or ii) based on the first control signal and the second control signal keeping the output of the second NAND gate to be "1" and the output of the second NOR gate to be "0" if the second interface is selected to receive the lower-speed-type data or in response to receiving an on die termination (ODT) enable signal for enabling an ODT mode.

15. The method of claim 14, further comprising:

generating the first control signal based on the ODT enable signal by an additional first NOR gate that has a first input for receiving the ODT enable signal, a second input for receiving an inverted higher-speed-type enable signal, and an output for outputting the first control signal to the second input of the second NAND gate, and generating the second control signal based on the first control signal by an additional inverter that receives the first control signal from the output of the additional first NOR gate and outputs the second control signal to the second input of the second NOR gate, the second control signal being an inversion of the first control signal.

16. The method of claim 14, further comprising:

generating a third control signal based on the ODT enable signal by an additional second NOR gate that has a first input for receiving the ODT enable signal, a second input for receiving a higher-speed-type enable signal, and an output for outputting the third control signal, wherein the third logic subcircuit comprises:

a third inverter having an input coupled to the output of the additional second NOR gate for receiving the third control signal and an output for outputting an inverted third control signal, a first OR gate having a first input coupled to the output of the third inverter for receiving the inverted third control signal, a second input coupled to the second interface for receiving the lower-speed-type data, and an output, and a first AND gate having a first input coupled to the output of the first OR gate, a second input for receiving an output enable signal, and an output coupled to the second input of the first NAND gate in each of the one or more first driving subcircuits, wherein the fourth logic subcircuit comprises:

a second AND gate having a first input coupled to the second interface for receiving the lower-speed-type data, a second input coupled to the output of the additional second NOR gate for receiving the third control signal, and an output, and a second OR gate having a first input coupled to the output of the second AND gate, a second input for receiving an inversion of the output enable signal, and an output coupled to the second input of the first NOR gate in each of the one or more second driving subcircuits.

17. The method of claim 16, further comprising at least one of:

i) enabling to output the lower-speed-type data if the second interface is selected to receive the lower-speed-type data, ii) keeping the output of the first AND gate to be "1" and the output of the second OR gate to be "0" if the first interface is selected to receive the higher-speed-type data or in response to receiving the ODT enable signal for enabling the ODT mode and the output enable signal with a higher voltage level, or iii) keeping the output of the first AND gate to be "0" and the output of the second OR gate to be "1" in response to receiving an output disable signal for disabling the data output of the driving circuit.

18. The method of claim 16, wherein the driving circuit comprises a plurality of first driving subcircuits coupled in parallel with the supply voltage and the data output and a plurality of second driving subcircuits coupled in parallel with the data output and the electrical ground, wherein the first AND gate comprises a third input for receiving a first selection signal for selecting one or more particular first driving subcircuits for data transfer among the plurality of first driving subcircuits, wherein the second OR gate comprises a third input for receiving a second selection signal for selecting one or more particular second driving subcircuits for the data transfer among the plurality of second driving subcircuits, and wherein each of the first selection signal and the second selection signal is associated with a predetermined impedance for the driving circuit, and wherein the predetermined impedance for the driving circuit is based on a combination of the one or more particular first driving subcircuits and the one or more particular second driving subcircuits.

19. An integrated circuit, comprising:

a first interface for receiving higher-speed-type data;
a second interface for receiving lower-speed-type data;
a first logic circuit coupled to the first interface;
a second logic circuit coupled to the second interface; and
a driving circuit separately coupled to the first logic circuit and the second logic circuit, wherein the driving circuit is configured to output i) data corresponding to the higher-speed-type data if the first interface receives the higher-speed-type data, and ii) data corresponding to the lower-speed-type data if the second interface receives the lower-speed-type data, wherein the first interface, the first logic circuit, and the driving circuit are arranged to form a first data path for transferring the higher-speed-type data with a first speed, and wherein the second interface, the second logic circuit, and the driving circuit are arranged to form a second data path for transferring the lower-speed-type data with a second speed, the first speed being higher than the second speed, wherein the driving circuit comprises: one or more first driving subcircuits each comprising at least one first-type transistor and one or more second driving subcircuits each comprising at least one second-type transistor, wherein the first logic circuit comprises a first logic subcircuit coupled to the one or more first driving subcircuits and a second logic subcircuit coupled to the one or more second driving subcircuits, and wherein the second logic circuit comprises a third logic subcircuit coupled to the one or more first driving subcircuits and a fourth logic subcircuit coupled to the one or more second driving subcircuits, wherein the driving circuit comprises a data output, and wherein the one or more first driving subcircuits are coupled between a supply voltage and the data output, and the one or more second driving subcircuits are coupled between the data output and an electrical ground, wherein each of the one or more first driving subcircuits comprises two first-type transistors coupled in series between the supply voltage and the data output, and wherein each of the first logic subcircuit and the third logic subcircuit is coupled to a respective first-type transistor of the two first-type transistors in each of the one or more first driving subcircuits, wherein each of the one or more second driving subcircuits comprises two second-type transistors coupled in series between the data output and the electrical ground, and wherein each of the second logic subcircuit and the fourth logic subcircuit is coupled to a respective second-type transistor of the two second-type transistors in each of the one or more second driving subcircuits, wherein the second logic circuit is configured such that, if the first interface is selected to receive the higher-speed-type data, the respective first-type transistor coupled to the third logic subcircuit and the respective second-type transistor coupled to the fourth logic subcircuit are turned on, and the driving circuit outputs the data corresponding to the higher-speed-type data at the data output, and wherein the first logic circuit is configured such that, if the second interface is selected to receive the lower-speed-type data, the respective first-type transistor coupled to the first logic subcircuit and the respective second-type transistor coupled to the second logic subcircuit are turned on, and the driving circuit outputs the data corresponding to the lower-speed-type data at the data output.

20. An integrated circuit, comprising:

a first interface for receiving higher-speed-type data;

a second interface for receiving lower-speed-type data;

a first logic circuit coupled to the first interface;

a second logic circuit coupled to the second interface; and a driving circuit separately coupled to the first logic circuit and the second logic circuit, wherein the driving circuit is configured to output i) data corresponding to the higher-speed-type data if the first interface receives the higher-speed-type data, and ii) data corresponding to the lower-speed-type data if the second interface receives the lower-speed-type data, wherein the first interface, the first logic circuit, and the driving circuit are arranged to form a first data path for transferring the higher-speed-type data with a first speed, and wherein the second interface, the second logic circuit, and the driving circuit are arranged to form a second data path for transferring the lower-speed-type data with a second speed, the first speed being higher than the second speed, wherein the driving circuit comprises: one or more first driving subcircuits each comprising at least one first-type transistor, and one or more second driving subcircuits each comprising at least one second-type transistor, wherein the first logic circuit comprises a first logic subcircuit coupled to the one or more first driving subcircuits and a second logic subcircuit coupled to the one or more second driving subcircuits, and wherein the second logic circuit comprises a third logic subcircuit coupled to the one or more first driving subcircuits and a fourth logic subcircuit coupled to the one or more second driving subcircuits, wherein the driving circuit comprises a data output, and wherein the one or more first driving subcircuits are coupled between a supply voltage and the data output, and the one or more second driving subcircuits are coupled between the data output and an electrical ground, wherein each of the one or more first driving subcircuits comprises: a first-type transistor coupled between the supply voltage and the data output, and a first NAND gate having a first input coupled to the first logic subcircuit, a second input coupled to the third logic subcircuit, and an output coupled to the first-type transistor, wherein each of the one or more second driving subcircuits comprises: a second-type transistor coupled between the data output and the electrical ground, and a first NOR gate having a first input coupled to the second logic subcircuit, a second input coupled to the fourth logic subcircuit, and an output coupled to the second-type transistor, wherein the first logic subcircuit comprises: a first inverter configured to invert the higher-speed-type data from the first interface, and a second NAND gate having a first input for receiving the inverted higher-speed-type data from the first inverter, a second input for receiving a first control signal, and an output coupled to the first input of the first NAND gate in each of the one or more first driving subcircuits, wherein the second logic subcircuit comprises: a second inverter configured to invert the higher-speed-type data from the first interface, and a second NOR gate having a first input for receiving the inverted higher-speed-type data from the second inverter, a second input for receiving a second control signal, and an output coupled to the first input of the first NOR gate in each of the one or more second driving subcircuits, and wherein the first control signal and the second control signal are configured to perform at least one of:

i) allowing to output the higher-speed-type data if the first interface is selected to receive the higher-speed-type data, or ii) keeping the output of the second NAND gate to be "1" and the output of the second NOR gate to be "0" if the second interface is selected to receive the lower-speed-type data or in response to receiving an on die termination (ODT) enable signal for enabling an ODT mode.

* * * * *